US010287708B2

(12) United States Patent
Nishibayashi et al.

(10) Patent No.: US 10,287,708 B2
(45) Date of Patent: May 14, 2019

(54) SINGLE-CRYSTAL DIAMOND MATERIAL, SINGLE-CRYSTAL DIAMOND CHIP, AND PERFORATED TOOL

(71) Applicants: Sumitomo Electric Industries, Ltd., Osaka-shi (JP); SUMITOMO ELECTRIC HARDMETAL CORP., Itami-shi (JP)

(72) Inventors: Yoshiki Nishibayashi, Itami (JP); Natsuo Tatsumi, Itami (JP); Hitoshi Sumiya, Itami (JP); Akihiko Ueda, Itami (JP); Yutaka Kobayashi, Itami (JP)

(73) Assignees: SUMITOMO ELECTRIC INDUSTRIES, LTD., Osaka (JP); SUMITOMO ELECTRIC HARDMETAL CORP., Hyogo (JP)

( * ) Notice: Subject to any disclaimer, the term of this patent is extended or adjusted under 35 U.S.C. 154(b) by 0 days.

(21) Appl. No.: 15/519,757

(22) PCT Filed: Jul. 22, 2016

(86) PCT No.: PCT/JP2016/071603
§ 371 (c)(1),
(2) Date: Apr. 17, 2017

(87) PCT Pub. No.: WO2017/014311
PCT Pub. Date: Jan. 26, 2017

(65) Prior Publication Data
US 2017/0241042 A1    Aug. 24, 2017

(30) Foreign Application Priority Data

Jul. 22, 2015    (JP) .................................. 2015-145025

(51) Int. Cl.
*B32B 3/10*    (2006.01)
*C30B 29/04*    (2006.01)
(Continued)

(52) U.S. Cl.
CPC .............. *C30B 29/04* (2013.01); *B21C 3/025* (2013.01); *C23C 16/27* (2013.01); *C23C 16/274* (2013.01);
(Continued)

(58) Field of Classification Search
CPC ....... B21C 3/025; C23C 16/27; C23C 16/274; B23B 51/00; C30B 25/105; C30B 25/20; C30B 29/04; C30B 9/00
See application file for complete search history.

(56) References Cited

U.S. PATENT DOCUMENTS 5,908,503 A * 6/1999 Sumiya .................... B01J 3/062
117/79
2007/0033810 A1* 2/2007 Sumiya ...................... B01J 3/06
30/165
2015/0176155 A1* 6/2015 Ueda ....................... C30B 29/04
428/408

FOREIGN PATENT DOCUMENTS

EP    3170926 A1    5/2017
EP    3173510 A1    5/2017
(Continued)

OTHER PUBLICATIONS

JP 2015034114 A machine translation.*
(Continued)

*Primary Examiner* — Travis M Figg
(74) *Attorney, Agent, or Firm* — Baker Botts L.L.P.; Michael A. Sartori

(57) ABSTRACT

In a single-crystal diamond material, a concentration of non-substitutional nitrogen atoms is not more than 200 ppm,
(Continued)

a concentration of substitutional nitrogen atoms is lower than the concentration of the non-substitutional nitrogen atoms, and the single-crystal diamond material has a crystal growth main surface having an off angle of not more than 20°. A perforated tool includes a single-crystal diamond die, wherein in the single-crystal diamond die, a concentration of non-substitutional nitrogen atoms is not more than 200 ppm, a concentration of substitutional nitrogen atoms is lower than the concentration of the non-substitutional nitrogen atoms, and the single-crystal diamond die has a low-index plane represented by a Miller index of not less than −5 and not more than 5 in an integer, a perpendicular line of the low-index plane having an off angle of not more than 20° relative to an orientation of a hole for wire drawing.

16 Claims, 3 Drawing Sheets

(51) Int. Cl.
| | |
|---|---|
| C23C 16/27 | (2006.01) |
| C30B 25/20 | (2006.01) |
| B21C 3/02 | (2006.01) |
| C30B 9/00 | (2006.01) |
| C30B 25/10 | (2006.01) |
| C30B 25/18 | (2006.01) |

(52) U.S. Cl.
CPC .............. *C30B 9/00* (2013.01); *C30B 25/105* (2013.01); *C30B 25/186* (2013.01); *C30B 25/20* (2013.01)

(56) References Cited

FOREIGN PATENT DOCUMENTS

| | | | | |
|---|---|---|---|---|
| EP | 3214208 | A1 | 9/2017 | |
| JP | 59-229227 | A | 12/1984 | |
| JP | 64-075678 | A | 3/1989 | |
| JP | 2000-288804 | A | 10/2000 | |
| JP | 2000-515818 | A | 11/2000 | |
| JP | 2002-102917 | A | 4/2002 | |
| JP | 2004-214264 | A | 7/2004 | |
| JP | 2009-518273 | A | 5/2009 | |
| JP | 2009518273 | A * | 5/2009 | |
| JP | 2013-527117 | A | 6/2013 | |
| JP | WO 2014003110 | A1 * | 1/2014 | ............. C30B 29/04 |
| JP | 2015034114 | A * | 2/2015 | |
| JP | 2015034114 | A * | 2/2015 | |
| WO | 98/04382 | A1 | 2/1998 | |
| WO | 2007/066215 | A2 | 6/2007 | |
| WO | 2011/151416 | A2 | 12/2011 | |
| WO | WO-2011151416 | A2 * | 12/2011 | ............. B24D 99/00 |
| WO | WO 2011151416 | A2 * | 12/2011 | ............. B24D 99/00 |
| WO | 2016/010028 | A1 | 1/2016 | |
| WO | 2016/013588 | A1 | 1/2016 | |
| WO | 2016/068244 | A1 | 5/2016 | |

OTHER PUBLICATIONS

JP 2009518273 A machine translation.*
New Diamond, vol. 2, No. 3, pp. 6-12, 1986 [Partial Translation].
Martineau et al., "Identification of Synthetic Diamond Grown Using Chemical Vapor Deposition (CVD)," Gems & Gemology, vol. 40, No. 1, pp. 2-25, 2004.

* cited by examiner

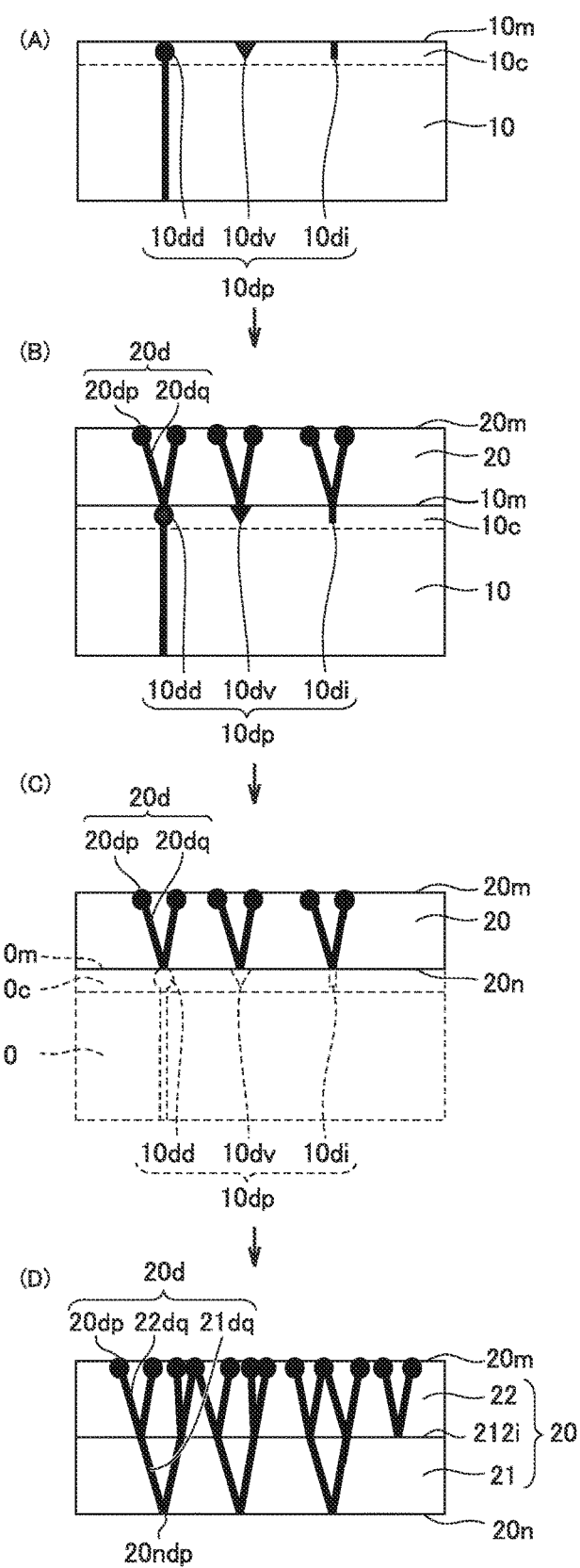

SINGLE-CRYSTAL DIAMOND MATERIAL, SINGLE-CRYSTAL DIAMOND CHIP, AND PERFORATED TOOL

TECHNICAL FIELD

The present invention relates to a single-crystal diamond material, a single-crystal diamond chip, and a perforated tool. The present application claims a priority based on Japanese Patent Application No. 2015-145025 filed on Jul. 22, 2015, the entire content of which is incorporated herein by reference.

BACKGROUND ART

Conventionally, a natural single-crystal diamond has been frequently used for a perforated tool, an abrasion-resistant tool, a cutting tool, and the like. Sometimes, a single-crystal diamond synthesized under a high pressure has been used. For example, each of Japanese Patent Laying-Open No. 2000-288804 (Patent Document 1), Japanese National Patent Publication No. 2000-515818 (Patent Document 2), and Japanese Patent Laying-Open No. 2002-102917 (Patent Document 3) discloses a tool insert and a wire drawing die, which include: an insert body and a die main body; and a grindstone chip composed of a natural or artificial diamond.

A single-crystal diamond is absolutely harder than other materials. Hence, even if any type of diamond is employed for perforated tools, abrasion-resistant tools, and cutting tools, these tools are hardly worn and can be used equally. Actually, they are being used with no particular problem.

CITATION LIST

Patent Document

PTD 1: Japanese Patent Laying-Open No. 2000-288804
PTD 2: Japanese National Patent Publication No. 2000-515818
PTD 3: Japanese Patent Laying-Open No. 2002-102917

SUMMARY OF INVENTION

In a single-crystal diamond material according to a certain embodiment of the present disclosure, a concentration of non-substitutional nitrogen atoms is not more than 200 ppm, a concentration of substitutional nitrogen atoms is lower than the concentration of the non-substitutional nitrogen atoms, and the single-crystal diamond material has a crystal growth main surface having an off angle of not more than 20°.

In a single-crystal diamond chip according to another embodiment of the present disclosure, a concentration of non-substitutional nitrogen atoms is not more than 200 ppm, a concentration of substitutional nitrogen atoms is lower than the concentration of the non-substitutional nitrogen atoms, and the single-crystal diamond chip has a main surface with an off angle of not more than 20°.

A perforated tool according to still another embodiment of the present disclosure includes a single-crystal diamond die, wherein in the single-crystal diamond die, a concentration of non-substitutional nitrogen atoms is not more than 200 ppm, a concentration of substitutional nitrogen atoms is lower than the concentration of the non-substitutional nitrogen atoms, and the single-crystal diamond die has a low-index plane represented by a Miller index of not less than −5 and not more than 5 in an integer, a perpendicular line of the low-index plane having an off angle of not more than 20° relative to an orientation of a hole for wire drawing.

BRIEF DESCRIPTION OF DRAWINGS

FIG. 4 is a schematic cross sectional view showing a method of producing a single-crystal diamond material according to the embodiment of the present invention.

DESCRIPTION OF EMBODIMENTS

Figure 1:
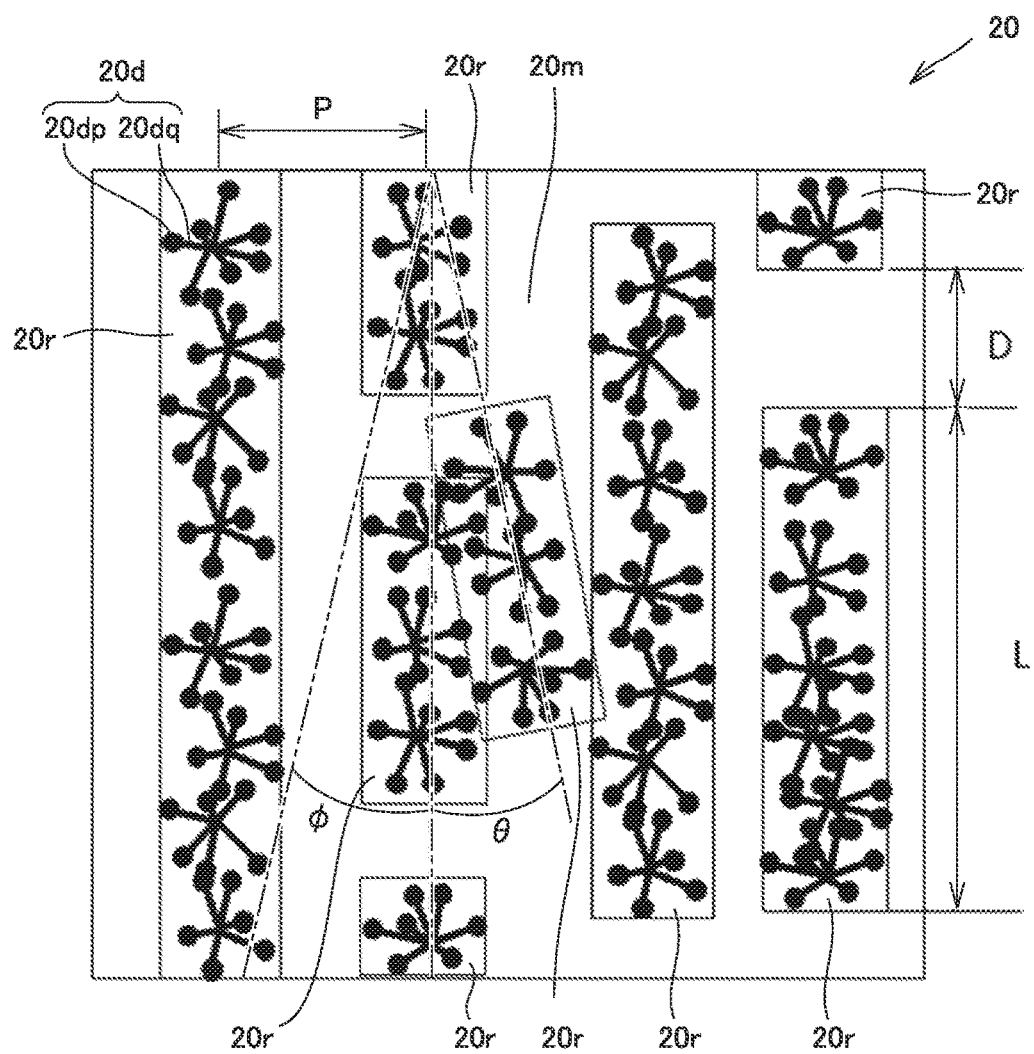
FIG. 1 is a schematic view showing an exemplary X-ray topography image for a crystal growth main surface of a single-crystal diamond material according to an embodiment of the present invention.

Technical Problem to be Solved by the Present Disclosure

With detailed observation, it can be confirmed that perforated tools, abrasion-resistant tools, or cutting tools (such as wire drawing dies and cutting bites), which are considered to have been used in the same manner, are different from one another in terms of a degree of occurrence of large chipping and a wear rate. This is due to the following reason. An act of machining (for example, wire drawing) is a phenomenon taking place with a very complicated mechanism. Hence, particular attention has not been paid to the difference. Specifically, first, workpieces do not have completely the same characteristics. The workpieces are slightly varied in characteristics such as elastic modulus, Young's modulus, hardness, strength, and the like. Moreover, in machining with machines, motors or pressures or tensions on workpieces are slightly varied, with the result that pressing forces and pulling forces for the workpieces will be slightly different. When machining is performed in a dry method, it is considered that the machining is affected by temperature of chamber and humidity; however, the machining is not always performed at the same temperature of chamber and the same humidity. On the other hand, when machining is performed in a wet method, there are various types of cooling agents and lubricants and respective qualities thereof are slightly varied. As such, there are various types of parameters related to one another, so that it is considered that when a certain parameter is slightly different, wear is greatly affected. Due to such a complicated phenomenon, these parameters are not intended to be controlled even though it might be recognized that wear is greatly affected due to the difference at the side of the perforated tools, abrasion-resistant tools, and cutting tools.

However, large chipping are actually caused in the perforated tools, and abrasion-resistant tools and cutting tools, or large wear rate variation are actually resulted among the perforated tools, abrasion-resistant tools, and cutting tools, disadvantageously. Regarding this, in order for manufacturers of workpieces to produce high-quality workpieces with low cost, it is very important and challenging to manage perforated tools, abrasion-resistant tools, and cutting tools, exchange the tools within an appropriate time, and always produce uniform workpieces.

Therefore, in order to solve the above-described problem, it is an object to provide a single-crystal diamond material, a single-crystal diamond chip, and a perforated tool, by each of which occurrence of large chipping is suppressed and small wear rate variation is achieved.

Effect of the Present Disclosure

According to the above description, there can be provided a single-crystal diamond material, a single-crystal diamond chip, and a perforated tool, by each of which occurrence of large chipping is suppressed and small wear rate variation is achieved.

Description of Embodiment of the Present Invention

First, embodiments of the present invention are listed and described.

[1] In a single-crystal diamond material according to a certain embodiment of the present invention, a concentration of non-substitutional nitrogen atoms is not more than 200 ppm, a concentration of substitutional nitrogen atoms is lower than the concentration of the non-substitutional nitrogen atoms, and the single-crystal diamond material has a crystal growth main surface having an off angle of not more than 20°. According to such a single-crystal diamond material, occurrence of large chipping is suppressed and small wear rate variation is achieved.

[2] Further in the single-crystal diamond material according to the present embodiment, the crystal growth main surface can have an off angle of less than 7°. According to such a single-crystal diamond material, occurrence of large chipping is suppressed and smaller wear rate variation is achieved.

[3] Further in the single-crystal diamond material according to the present embodiment, the concentration of the substitutional nitrogen atoms can be less than 80 ppm. According to such a single-crystal diamond material, occurrence of large chipping is suppressed and smaller wear rate variation is achieved.

[4] Further in the single-crystal diamond material according to the present embodiment, a concentration of all nitrogen atoms, which are a whole of the non-substitutional nitrogen atoms and the substitutional nitrogen atoms, can be not less than 0.1 ppm. According to such a single-crystal diamond material, occurrence of large chipping is suppressed and smaller wear rate variation is achieved.

[5] Further in the single-crystal diamond material according to the present embodiment, an angle of deviation from parallelism between the crystal growth main surface and a main surface opposite to the crystal growth main surface can be less than 2°, the main surface opposite to the crystal growth main surface can have an undulation with a maximum height difference Dm of not more than 10 μm/mm, and can have an arithmetic mean roughness Ra of not more than 0.1 μm. According to such a single-crystal diamond material, control for an off angle of a main surface of a chip to be cut out therefrom can be readily performed.

[6] Further in the single-crystal diamond material according to the present embodiment, in an X-ray topography image for the crystal growth main surface, groups of crystal defect points can be gathered, each of the crystal defect points being a tip point of a crystal defect line reaching the crystal growth main surface, the crystal defect line representing a line in which a crystal defect exists. According to such a single-crystal diamond material, occurrence of large chipping is suppressed further.

[7] Further in the single-crystal diamond material according to the present embodiment, a density of the crystal defect points can be more than 2 $mm^{-2}$. According to such a single-crystal diamond material, occurrence of large chipping is suppressed further.

[8] Further in the single-crystal diamond material according to the present embodiment, a density of combined dislocation points of the crystal defect points can be more than 2 $mm^{-2}$, each of the combined dislocation points being a tip point of a combined dislocation reaching the crystal growth main surface, the combined dislocation resulting from a combination of at least either of a plurality of edge dislocations and a plurality of screw dislocations. According to such a single-crystal diamond material, occurrence of large chipping is suppressed further.

[9] Further, the single-crystal diamond material according to the present embodiment can include a plurality of single-crystal diamond layers. According to such a single-crystal diamond material, occurrence of large chipping is suppressed further.

[10] Further in the single-crystal diamond material according to the present embodiment, the crystal defect line can be newly generated or branched at an interface between the single-crystal diamond layers, and a density of the crystal defect points in the crystal growth main surface can be higher than a density of the crystal defect points in a main surface opposite to the crystal growth main surface. According to such a single-crystal diamond material, occurrence of large chipping is suppressed further.

[11] Further in the single-crystal diamond material according to the present embodiment, a plurality of crystal defect line-like gathered regions can exist in parallel, and in each of the plurality of crystal defect line-like gathered regions, groups of the crystal defect points can be gathered to extend in a form of lines. According to such a single-crystal diamond material, occurrence of large chipping is suppressed further.

[12] Further in the single-crystal diamond material according to the present embodiment, the concentration of the non-substitutional nitrogen atoms can be not less than 1 ppm. According to such a single-crystal diamond material, occurrence of large chipping is suppressed further.

[13] Further in the single-crystal diamond material according to the present embodiment, when the single-crystal diamond material has a thickness of 500 μm, a transmittance for light having a wavelength of 400 nm can be not more than 60%. According to such a single-crystal diamond material, occurrence of large chipping is suppressed further.

[14] In a single-crystal diamond chip according to another embodiment of the present invention, a concentration of non-substitutional nitrogen atoms can be not more than 200 ppm, a concentration of substitutional nitrogen atoms can be lower than the concentration of the non-substitutional nitrogen atoms, and the single-crystal diamond chip can have a main surface with an off angle of not more than 20°. According to such a single-crystal diamond chip, occurrence of large chipping is suppressed and small wear rate variation is achieved.

[15] A single-crystal diamond chip according to still another embodiment of the present invention is cut out from the single-crystal diamond material recited in the foregoing embodiment. According to such a single-crystal diamond chip, occurrence of large chipping is suppressed and small wear rate variation is achieved.

[16] Further in the single-crystal diamond chip according to the present embodiment, the main surface of the single-crystal diamond chip can be a low-index plane represented by a Miller index of not less than −5 and not more than 5 in an integer. According to such a single-crystal diamond chip, occurrence of large chipping is suppressed and small wear rate variation is achieved.

[17] Further in the single-crystal diamond chip according to the present embodiment, in an X-ray topography image for one of a crystal growth main surface and a main surface parallel to the crystal growth main surface of the single-crystal diamond chip, groups of crystal defect points can be gathered, each of the crystal defect points being a tip point of a crystal defect line reaching one of the crystal growth main surface and the main surface parallel to the crystal growth main surface, the crystal defect line representing a line in which a crystal defect exists, and a density of the crystal defect points can be more than 2 mm$^{-2}$. According to the single-crystal diamond chip, occurrence of large chipping is suppressed further.

[18] In a perforated tool including a single-crystal diamond die according to yet another embodiment of the present invention, in the single-crystal diamond die, a concentration of non-substitutional nitrogen atoms is not more than 200 ppm, a concentration of substitutional nitrogen atoms is lower than the concentration of the non-substitutional nitrogen atoms, and the single-crystal diamond die has a low-index plane represented by a Miller index of not less than −5 and not more than 5 in an integer, a perpendicular line of the low-index plane having an off angle of not more than 20° relative to an orientation of a hole for wire drawing. According to such a perforated tool, occurrence of large chipping of the single-crystal diamond die is suppressed and small wear rate variation is achieved.

[19] Moreover, a perforated tool according to further another embodiment of the present invention includes a single-crystal diamond die formed from the single-crystal diamond chip recited in the foregoing embodiment. According to such a perforated tool, occurrence of large chipping of the single-crystal diamond die is suppressed and small wear rate variation is achieved.

[20] Further in the perforated tool according to the present embodiment, in an X-ray topography image for a crystal growth main surface of the single-crystal diamond die, groups of crystal defect points can be gathered, the crystal defect points being a tip point of a crystal defect line reaching the crystal growth main surface, the crystal defect line representing a line in which a crystal defect exists, and a density of the crystal defect points can be more than 2 mm$^{-2}$. According to such a perforated tool, occurrence of large chipping of the single-crystal diamond die is suppressed further.

[21] Further in the perforated tool according to the present embodiment, a density of combined dislocation points of the crystal defect points can be more than 2 mm$^{-2}$, each of the combined dislocation points being a tip point of a combined dislocation reaching the crystal growth main surface, the combined dislocation resulting from a combination of at least either of a plurality of edge dislocations and a plurality of screw dislocations. According to such a perforated tool, occurrence of large chipping of the single-crystal diamond die is suppressed further.

[22] Further in the perforated tool according to the present embodiment, the single-crystal diamond die can include a plurality of single-crystal diamond layers, and the crystal defect line can be newly generated or branched at an interface between the single-crystal diamond layers, and a density of the crystal defect points of the crystal growth main surface can be higher than a density of the crystal defect points of a main surface opposite to the crystal growth main surface. According to such a perforated tool, occurrence of large chipping of the single-crystal diamond die is suppressed further.

[23] Further in the perforated tool according to the present embodiment, in the single-crystal diamond die, a plurality of crystal defect line-like gathered regions can exist in parallel, and in each of the plurality of crystal defect line-like gathered regions, groups of the crystal defect points can be gathered to extend in a form of lines. According to such a perforated tool, occurrence of large chipping of the single-crystal diamond die is suppressed further.

[24] Further in the perforated tool according to the present embodiment, in the single-crystal diamond die, the concentration of the non-substitutional nitrogen atoms can be not less than 1 ppm. According to such a perforated tool, occurrence of large chipping of the single-crystal diamond die is suppressed further.

[25] Further in the perforated tool according to the present embodiment, in the single-crystal diamond die, a transmittance for light having a wavelength of 400 nm can be not more than 60% when the single-crystal diamond die has a thickness of 500 μm. According to such a perforated tool, occurrence of large chipping of the single-crystal diamond die is suppressed further.

DETAILS OF EMBODIMENTS OF THE PRESENT INVENTION

First Embodiment: Single-Crystal Diamond Material

Figure 2:
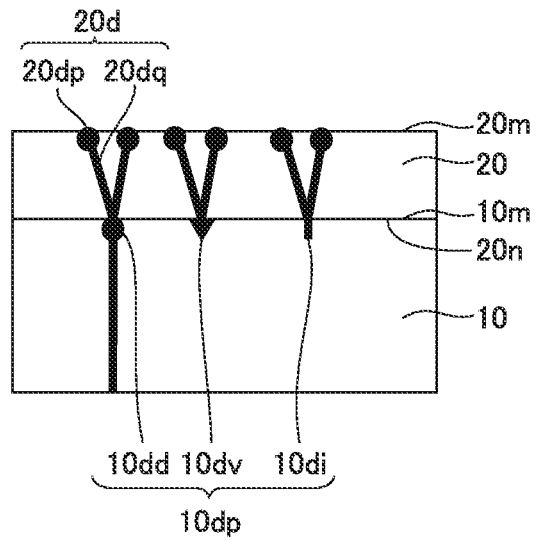
FIG. 2 is a schematic cross sectional view showing an exemplary cross section perpendicular to the crystal growth main surface of the single-crystal diamond material according to the embodiment of the present invention.
Figure 3:
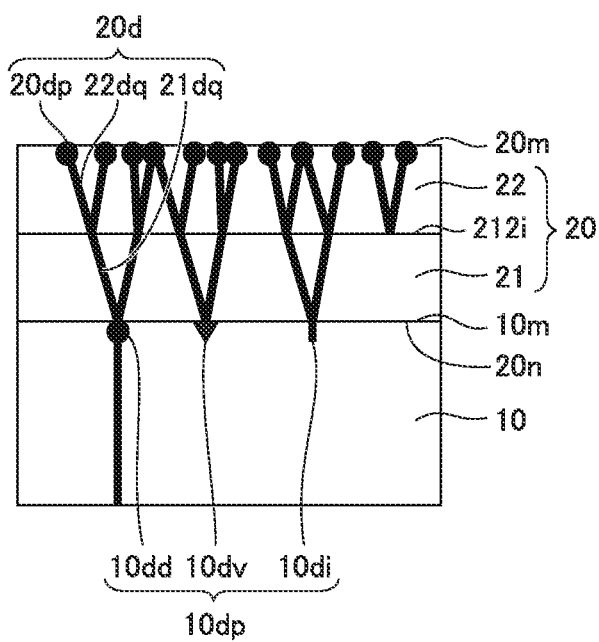
FIG. 3 is a schematic cross sectional view showing another exemplary cross section perpendicular to the crystal growth main surface of the single-crystal diamond material according to the embodiment of the present invention.

With reference to FIG. 1 to FIG. 3, in a single-crystal diamond material 20 of the present embodiment, a concentration of non-substitutional nitrogen atoms is not more than 200 ppm, a concentration of substitutional nitrogen atoms is lower than the concentration of the non-substitutional nitrogen atoms, and the single-crystal diamond material has a crystal growth main surface having an off angle of not more than 20°. According to single-crystal diamond material 20 of the present embodiment, occurrence of large chipping is suppressed and wear rate variation is small. Here, crystal growth main surface 20m of single-crystal diamond material 20 refers to a main surface formed by crystal growth in the single-crystal diamond material. The term "main surface of single-crystal diamond material" refers to a main surface having a physical property as the single-crystal diamond material, and includes crystal growth main surface 20m, a main surface parallel to the crystal growth main surface, a main surface 20n opposite to crystal growth main surface 20m, and the like. It should be noted that whether a main surface of the single-crystal diamond material is one of the crystal growth main surface, the main surface parallel to the crystal growth main surface, and the main surface opposite to the crystal growth main surface can be identified based on an X-ray topography image for the main surface and/or a cross section crossing the main surface as described below.

From many factors, the inventors have found impurity variation and plane orientation variation within the single-crystal diamond material as factors of wear rate variation among perforated tools, abrasion-resistant tools, and cutting tools (for example, wire drawing dies).

However, conventionally, it is difficult to suppress the impurity variation and the plane orientation variation. For example, when a natural single-crystal diamond is used as a single-crystal diamond material, a plane orientation can be designated; however, an angle cannot be guaranteed with a high precision of not more than 20°. Sometimes, a single-crystal diamond material with a different plane orientation may be introduced. Furthermore, since natural single-crystal diamonds are formed naturally inside the earth, variation in concentration of atoms of nitrogen, which is an impurity, is large. Single-crystal diamonds having nitrogen atom concentrations varied by ±500 ppm are accepted as the same single-crystal diamond materials.

On the other hand, when an artificial single-crystal diamond formed by a high-pressure synthesis method is used as a single-crystal diamond material, a single-crystal diamond with a different plane orientation is not introduced. However, even when single-crystal diamonds angled off by not less than 10° are introduced by several/10% or when single-crystal diamonds angled off by not less than 5° are introduced by several %, they are accepted as the same single-crystal diamond materials. Moreover, although all the prepared single-crystal diamonds do not have an off angle of less than 3° with a probability of 100%, they are all utilized as single-crystal diamonds having a specific plane orientation. Further, nitrogen is naturally introduced into single-crystal diamond materials even though the single-crystal diamond materials are obtained by the high-pressure synthesis method. A certain concentration of introduced nitrogen is not guaranteed for the production. The concentrations in these single-crystal diamond materials are varied in the range of 80 to 250 ppm. A variation in the range of ±85 ppm is accepted.

Thus, not only the natural single-crystal diamond materials but also the artificial single-crystal diamond materials obtained by the high-pressure synthesis have variation in atoms of nitrogen, which is an impurity, as well as plane orientation variation. In perforated tools, polishing tools, cutting tools, or the like, wear rates of single-crystal diamond chips or single-crystal diamond dies formed using such single-crystal diamond materials will be varied in the range of 50% to 200% or more (in other words, a wear rate may become 0.5 time or 2.0 times as large as an average value of the wear rates).

There are the following approaches to reduce wear rate variation among single-crystal diamond materials. A first approach is to form a single-crystal diamond material by a vapor phase synthesis method. In the high-pressure synthesis method, nitrogen is introduced from a carbon material serving as a source material, a metal material of a solvent, or an atmosphere during the synthesis, and cannot be controlled as a molar unit (based on an amount of molecules as unit). On the other hand, according to the vapor phase synthesis method, a molar ratio of atoms of a synthesis gas can be controlled. Specifically, the molar ratio of the atoms of the synthesis gas serving as the source material is controlled based on a gas flow rate in a standard state and an unnecessary (unexpected) gas in a container is reduced to an amount much smaller than that of the source material gas, thereby controlling to attain a uniform concentration of nitrogen atoms in the single-crystal diamond material. Accordingly, variation in concentration of nitrogen atoms due to the introduction of unexpected gas from the source material, solvent, or synthesis atmosphere can be avoided. However, even when the vapor phase synthesis method is employed, a very small amount of nitrogen gas is introduced from a surrounding atmosphere. Hence, preferably, the single-crystal diamond material has a certain concentration of nitrogen atoms or more, rather than absolutely zero. In this case, the concentration of the nitrogen atoms in the single-crystal diamond material is stabilized. It should be noted that a certain concentration of nitrogen impurity is not necessarily attained in the material by setting a certain molar ratio in the synthesis gas. The concentration of the nitrogen impurity is dependent on external control factors such as pressure, temperature, and power; however, these factors can be controlled precisely. The following describes important factors that are difficult to control.

A second approach is to control the off angle of a main surface of a diamond seed crystal serving as a seed substrate for forming the single-crystal diamond material. The off angle of the main surface of the diamond seed crystal is a factor that affects introduction of an impurity and that is difficult to precisely control. The off angle of the main surface of the diamond seed crystal can be reduced by: determining a plane serving as a reference of angle and cutting using a laser having an excellent degree of parallelization; or calculating a degree of parallelization and cutting using a laser with a corrected degree of parallelization.

Specifically, although the laser is light with a high parallelism, a cut edge is formed into a wedge-like shape with an angle of several degrees due to intensity distribution in the radial direction when the laser is used for machining. Moreover, the laser machining is destructive machining and therefore does not ensure that workpieces are always machined in the same manner. A maximum height roughness Rz of a machined surface becomes not less than 10 μm. Here, maximum height roughness Rz refers to a maximum height roughness Rz defined in JIS B0601:2013. Moreover, workpieces are adhered to a certain member for the machining by the laser; however, the workpieces are not always adhered thereto in the same manner. When adhered, the workpieces are always inclined by several degrees. Further, for polishing, the workpieces are removed therefrom and are then attached to a jig for polishing. Also on this occasion, the workpieces are inclined by several degrees. Since polished surfaces are rough, finished polished surfaces are inclined by several degrees, with the result that the off angles of the main surfaces of the obtained single-crystal diamond materials are varied by not less than 20° in total.

In view of these, the present inventors modified a general laser machine uniquely (to change a focal depth out of standard while maintaining a degree of parallelization) in order to attain laser light with a degree of parallelization of less than 1°, and made a contrivance with regard to intensity in the laser light (by using a uniquely designed DOE lens or the like) in order to attain machining with which a degree of parallelization (deviation angle from parallelism in the present specification) of less than 1° is achieved after machining. Even if adjustment thereof is insufficient, a degree of parallelization of a machined plate can be less than 1° by correcting the axis of the laser light by ±1° in the cutting direction for both the surfaces of the machined plate when the degree of parallelization after machining is less than 2°. By this method, a seed crystal having a flat machined surface with a maximum height roughness Rz of not more than 5 μm can be produced. Since a plate-shaped seed crystal produced to securely have such flatness and degree of parallelization has a flat surface, no large variation is caused due to adhesion thereto during polishing, thereby forming a single-crystal diamond material having a main surface with an off angle of not more than 20° in total. However, more preferably, the single-crystal diamond material does not have an off angle of just zero. This is because an off angle of zero leads to substantially no atomic step to adversely result in instability in an amount of inclusion of an impurity such as nitrogen.

A third approach is to control concentration(s) of non-substitutional nitrogen atoms and/or substitutional nitrogen atoms in the single-crystal diamond material. With attention paid to a difference between single-crystal diamond materials due to a difference between manners of introduction of an impurity, the third approach is based on such a finding that occurrence of large chipping and a wear rate of a single-crystal diamond material are affected by a difference between the concentration of the substitutional nitrogen atoms and the concentration of the non-substitutional nitrogen atoms among the nitrogen atoms introduced in the single-crystal diamond material as an impurity.

In single-crystal diamond material 20 of the present embodiment, the concentration of the non-substitutional nitrogen atoms is not more than 200 ppm and the concentration of the substitutional nitrogen atoms is lower than the concentration of the non-substitutional nitrogen atoms, thereby suppressing occurrence of large chipping in the single-crystal diamond material while reducing wear rate variation among the single-crystal diamond materials. Moreover, since single-crystal diamond material 20 of the present embodiment is configured to have a main surface with an off angle of not more than 20°, plane orientation variation can be suppressed. Therefore, occurrence of large chipping can be suppressed while reducing wear rate variation since the concentration of the non-substitutional nitrogen atoms is not more than 200 ppm, the concentration of the substitutional nitrogen atoms is lower than the concentration of the non-substitutional nitrogen atoms, and the crystal growth main surface has an off angle of not more than 20° in single-crystal diamond material 20 of the present embodiment.

In single-crystal diamond material 20 of the present embodiment, the non-substitutional nitrogen atoms refers to nitrogen atoms obtained by excluding the substitutional nitrogen atoms from all the nitrogen atoms. The concentration of the non-substitutional nitrogen atoms refers to a concentration obtained by subtracting the concentration of the substitutional nitrogen atoms from the concentration of all the nitrogen atoms. Here, the concentration of all the nitrogen atoms is measured by SIMS (secondary ion mass spectrometry method), and the concentration of the substitutional nitrogen atoms is measured by ESR (electron spin resonance method).

Although not particularly limited, single-crystal diamond material 20 of the present embodiment is preferably formed by the vapor phase synthesis method. Since a molar ratio of respective atoms in the synthesis gas can be controlled in the vapor phase synthesis method, the concentration of the nitrogen atoms in single-crystal diamond material 20 can be controlled with higher precision than those in other methods.

In order to reduce the wear rate variation, in single-crystal diamond material 20 of the present embodiment, the concentration of the non-substitutional nitrogen atoms is not more than 200 ppm, is preferably not more than 110 ppm, and is more preferably not more than 55 ppm.

In order to reduce the wear rate variation, in single-crystal diamond material 20 of the present embodiment, the off angle of the main surface is not more than 20°, is preferably less than 10°, is more preferably less than 7°, is further preferably less than 5°, is still further preferably less than 3°, and is particularly preferably less than 1°. This indicates that the variation becomes smaller as θ, which represents the off angle, is smaller because binding of carbon in relation with wear resistance is weaken by $1/\cos θ$ and variation thereof is in relation with the magnitude of differentiation thereof and is therefore substantially correlated with $\sin θ$. Moreover, in addition, it is also indicated that as the off angle is smaller, the number of steps is decreased, a probability of including the impurity at the step is reduced, the impurity variation is reduced, and the wear rate variation is reduced. However, when the off angle is zero, the inclusion of the impurity becomes unstable adversely as described above. Quantitatively, the nitrogen impurity is affected by the number of atomic steps (lineal lengths) on the surface determined by the off angle. Since an interval between the atomic steps is proportional to $1/\sin θ$ of the off angle θ, the interval becomes too long (infinite in theory) when θ is zero, with the result that the impurity is extremely unlikely to be included therein. However, when the off angle is 0.005°, the step interval is about 1 μm, with the result that the impurity is on the order of several ppb as compared with that in the case of the off angle of 5° (several ppm). While not less than 1 ppb of nitrogen is preferably contained in total in view of the wear rate variation as described above, the off angle is preferably not less than 0.005° and is more preferably not less than 0.05° also in view of the wear rate variation. Here, the off angle of the main surface refers to an off angle relative to an arbitrarily specified crystal plane. Although the arbitrarily specified crystal plane is not particularly limited, a low-index plane represented by a Miller index of not less than −5 and not more than 5 in an integer is preferable in order to reduce the wear rate variation. The arbitrarily specified crystal plane is more preferably at least one plane having a plane orientation selected from a group consisting of {100}, {110}, {111}, {211}, {311}, and {331}.

In single-crystal diamond material 20 of the present embodiment, the concentration of the substitutional nitrogen atoms is lower than the concentration of the non-substitutional nitrogen atoms in order to suppress occurrence of large chipping and reduce wear rate variation. This is due to the following reason: when the concentration of the substitutional nitrogen atoms is higher than the concentration of the non-substitutional nitrogen atoms, a wear amount becomes large to result in large wear rate variation and occurrence of large chipping. Moreover, in single-crystal diamond material 20 of the present embodiment, in order to reduce the wear rate variation, the concentration of the substitutional nitrogen atoms is preferably less than 80 ppm, is more preferably less than 20 ppm, is still more preferably less than 15 ppm, is further preferably not more than 10 ppm, is still further preferably not more than 1 ppm, is yet further preferably not more than 0.5 ppm, is particularly preferably not more than 0.3 ppm, and is most preferably not more than 0.1 ppm.

In order to suppress large chipping while further reducing the wear rate variation, in single-crystal diamond material 20 of the present embodiment, the concentration of all the nitrogen atoms, i.e., the whole of the non-substitutional nitrogen atoms and the substitutional nitrogen atoms is preferably not less than 1 ppb (0.001 ppm), is more preferably not less than 0.01 ppm, is more preferably not less than 0.1 ppm, is further preferably not less than 1 ppm, and is particularly preferably not less than 10 ppm. When the concentration of all the nitrogen atoms is less than 0.1 ppb, an amount of naturally introduced nitrogen impurity becomes unstable to result in a brittle single-crystal diamond material.

In single-crystal diamond material 20 of the present embodiment, in order to facilitate growth of single-crystal diamond materials having less varied off angles on a diamond seed crystal and in order to facilitate control for an off angle of a main surface of a chip cut from single-crystal diamond material 20, an angle of deviation from parallelism between the crystal growth main surface and the main surface opposite to the crystal growth main surface is preferably less than 2°, is more preferably less than 0.1°, and is further preferably less than 0.05°. Here, the "angle of deviation from parallelism with the crystal growth main surface" means, in a strict sense, an "angle of deviation from parallelism with the main surface of the diamond seed crystal during growth". Since the main surface of the diamond seed crystal is transferred to the crystal growth main surface in parallel without any change, equivalency thereof is used. However, when the irregularity of the crystal growth main surface thus employing the degree of parallelization becomes large to result in decreased precision in degree of parallelization, the crystal growth main surface of the single-crystal diamond material is assumed as an initial crystal growth main surface grown to not more than 100 μm from the main surface of the diamond seed crystal. Since this will appear as a growth stripe, the crystal growth main surface at the initial stage of the growth becomes a stripe pattern when observed by an optical microscope, an SEM (scanning electron microscope), a CL (cathode luminescence), or a PL (photoluminescence) in cross section. Accordingly, a surface parallel thereto can be evaluated. Hence, when a plate thickness becomes more than 200 μm, there is employed an angle of deviation from parallelism with the crystal growth main surface in initial stage of growth within 200 μm, preferably 100 μm, and more preferably 50 μm from the main surface opposite to the crystal growth main surface. Moreover, in view of the same as described above, the main surface opposite to the crystal growth main surface has an undulation with a maximum height difference Dm of preferably not more than 10 μm/mm, more preferably not more than 5 μm/mm, and further preferably not more than 0.6 μm/mm, and has an arithmetic mean roughness Ra of preferably not more than 0.1 μm, more preferably not more than 50 nm, still more preferably not more than 10 nm, further preferably not more than 5 nm, and particularly preferably not more than 1 nm.

The angle of deviation from the parallelism between the crystal growth main surface (or the crystal growth main surface at the initial stage of the growth) and the main surface opposite to the crystal growth main surface of single-crystal diamond material 20 corresponds to an angle of deviation between the off angle of main surface 10m of diamond seed crystal 10 for growing single-crystal diamond material 20 and the off angle of crystal growth main surface 20m of single-crystal diamond material 20. Moreover, maximum height difference Dm of the undulation is not a PV value in a range of several hundred μm, but is a difference between the maximum value and the minimum value in a gradual level difference of the surface within a range of 1 mm. Maximum height difference Dm is not a relative value but is an absolute value based on the horizontal level of the main surface as a reference while excluding actual inclination of the sample (inclination of the main surface). Maximum height difference Dm can be measured by connecting 0.5-mm visual fields to each other, using a normal surface roughness measuring device employing white interference. Moreover, arithmetic mean roughness Ra refers to arithmetic mean roughness Ra defined in JIS B0601:2013, and can be measured using a white scanning type white interference type microscope (ZYGO provided by Canon).

A small angle of deviation from parallelism between crystal growth main surface 20m and main surface 20n opposite to crystal growth main surface 20m of single-crystal diamond material 20 ensures a small deviation between the off angle of main surface 10m of diamond seed crystal 10 and the off angle of main surface 20n opposite to crystal growth main surface 20m of single-crystal diamond material 20. This is because the off angle of main surface 20n opposite to crystal growth main surface 20m of single-crystal diamond material 20 grown on diamond seed crystal 10 does not necessarily precisely coincide with the off angle of main surface 20n opposite to crystal growth main surface 20m of single-crystal diamond material 20 removed from diamond seed crystal 10 after the growth. When single-crystal diamond material 20 is polished after being removed from diamond seed crystal 10 using a laser of ordinary technique, the angle of deviation becomes large to be not less than 2° from the parallelism between the main surface of single-crystal diamond material 20 removed from diamond seed crystal 10 (i.e., main surface 20n opposite to the crystal growth main surface) and crystal growth main surface 20m of single-crystal diamond material 20. In this case, it is impossible to finally produce tools with small off angle variation already at this point of time. Hence, a small angle of deviation from parallelism between crystal growth main surface 20m and main surface 20n opposite to the crystal growth main surface is necessary to produce tools with small off angle variation. Moreover, a small maximum height difference Dm of the undulation of main surface 20n opposite to the crystal growth main surface ensures small off angle variation among the main surfaces opposite to the crystal growth main surfaces of individual single-crystal diamond chips when cutting the single-crystal diamond chips out from the single-crystal diamond material. Although a single-crystal diamond chip is less than 1 mm square in many cases, when a surface thereof has an undulation of not less than 10 μm in that size, off angle variation become not less than 1° inclusive of portions before and after the undulation. Accordingly, it is also impossible to finally produce tools with small off angle variation. Hence, a small maximum height difference Dm of the undulation of main surface 20n opposite to the crystal growth main surface is also necessary to produce tools with small off angle variation. In addition to this, a small arithmetic mean roughness Ra of main surface 20n opposite to the crystal growth main surface is also an necessary, important point.

With reference to FIG. 1 and FIG. 2, preferably in single-crystal diamond material 20 of the present embodiment, in order to suppress occurrence of large chipping, in an X-ray topography image for crystal growth main surface 20m, groups of crystal defect points 20dp are gathered, each of crystal defect points 20dp being a tip point of a crystal defect line 20dq reaching crystal growth main surface 20m, crystal defect line 20dq representing a line in which a crystal defect exists. Here, the crystal growth main surface refers to a main surface formed by crystal growth. Here, in the present invention, the expression "groups of crystal defect points 20dp are gathered" has a specific meaning as follows. That is, one group of crystal defect points 20dp is a collection of a plurality of crystal defect points branched from one starting point or a collection of crystal defect points branched from the foregoing plurality of crystal defect points. A collection of crystal defect points branched from a different starting point is considered as a different group. Assuming that a minimum circle entirely including one group is expressed as an area of the group, it is expressed that groups are gathered when the area of a certain group is in contact with or overlaps with the area of another group.

In single-crystal diamond material 20 of the present embodiment, existence of crystal defect points 20dp and crystal defect lines 20dq is indicated in an X-ray topography image. Specifically, since the crystal defect points and the crystal defect lines have higher X-ray reflection intensities than those of the other portions in the crystal (portions with less defects, i.e., portions with high crystallinity), the existence of the crystal defect points and crystal defect lines are shown as dark portions in the case of a positive X-ray topography image and are shown as bright portions in the case of a negative X-ray topography image. Crystal defect lines 20dq are shown as the dark or bright portions in the form of lines, whereas crystal defect points 20dp are shown as intersections between a main surface such as crystal growth main surface 20m and crystal defect line 20dq.

Here, crystal defects 20d include various types of defects such as point defects, dislocations, chipping, cracks, and crystal strains. Moreover, the dislocations include edge dislocations, screw dislocations, and combined dislocations resulting from combinations of at least either of a plurality of edge dislocations and a plurality of screw dislocations.

Each of crystal defect lines 20dq constituted of such crystal defects 20d and the like is stopped when a crystal defect line 20dq is newly generated or a crystal defect line 20dq reaches crystal growth main surface 20m. The tip point of crystal defect line 20dq reaching crystal growth main surface 20m is referred to as "crystal defect point 20dp". In the present invention, the number of crystal defect points 20dp per unit area is counted to define a density of crystal defect points 20dp. Since it is practically impossible to count not less than $1\times10^4$ crystal defect points in the present invention, an average value of the crystal defect points in at least five locations within an arbitrary region with a limited range may be taken as follows. The crystal defect points are counted within the region with a limited range such as a region of 1 mm square when there are expected to be not less than 10 crystal defect points/mm$^2$, a region of 500 μm square when there are expected to be not less than 100 crystal defect points/mm$^2$, or a region of 100 μm square when there are expected to be not less than $1\times10^4$ crystal defect points/mm$^2$. Then, the crystal defect points thus counted are converted into a unit of mm$^{-2}$. In doing so, the region in which the number of crystal defect points 20dp is counted must be a region including the crystal defect gathered regions. Here, the crystal defect gathered region refers to a region in which crystal defect points 20dp are gathered. A crystal defect gathered region extending in the form of a line is referred to as a "crystal defect line-like gathered region 20r". If it is unknown which one of the stopped portions of crystal defect line 20dq reaches crystal growth main surface 20m, the crystal defect point is specified by changing incident angle and diffracting plane for a transmission type X-ray topography image or by capturing a reflection type X-ray topography image.

On the other hand, crystal defect line 20dq is a crystal defect point 20dp at crystal growth main surface 20m, so that the density of the crystal defect lines in the vicinity of crystal growth main surface 20m is equal to the density of the crystal defect points. A crystal defect line exists also inside the crystal and there is an intersection thereof with an arbitrary surface. The density of such intersections corresponds to the density of the crystal defect lines in the surface. Examples of the arbitrary surface include: an interface 212i between single-crystal diamond layers 21, 22 grown in the form of layers shown in FIG. 3; a surface parallel to interface 212i therearound.

Each crystal defect line-like gathered region 20r is formed by crystal defect points 20dp, which are the tip points of crystal defect lines 20dq and which are gathered in the form of lines at crystal growth main surface 20m, each of crystal defect lines 20dq being a line in which the crystal defect exists. Accordingly, crystal defect line-like gathered region 20r can be shown suitably in an X-ray topography image measured in the transmission type in a direction parallel to the crystal growth direction of the single-crystal diamond material (i.e., a direction perpendicular to the crystal growth main surface). Although an X-ray topography image can be measured in the reflection type, the crystal defect lines are overlapped in the X-ray topography image measured in the reflection type, with the result that it becomes difficult to discern a state of gathering of the crystal defect points. Since it is necessary to observe the high density of crystal defect points in the present invention, it is preferable to use X rays, which are synchrotron radiation, for the X-ray topography image. For the transmission type, the measurement is performed using X rays with a wavelength of 0.71 Å and (220) diffraction of $2\theta=32.9°$, for example. On the other hand, for the reflection type, the measurement may be performed using X rays with a wavelength of 0.96 Å and (113) diffraction of $2\theta=52.4°$. If crystal defect points 20dp are not discerned as described above, the crystal defect points are specified by capturing an image in a different wavelength and at a different angle of diffraction. Similarly, the measurement may be performed using an X-ray diffractometer of a laboratory system. For example, (111) diffraction may be observed using a Mo radiation source or (113) diffraction may be observed using a Cu radiation source; however, a long measurement time is required to capture an image with high resolution. Although a CCD camera can be used for the measurement, it is desirable to use a nuclear plate to increase resolution. It is desirable to perform all of storage, development, and fixing of the nuclear plate in a cool environment of not more than 10° C. After the development, an image is captured with an optical microscope to quantify crystal defect points 20dp and crystal defect lines 20dq. Although there is also a method (double-refraction method) employing double refraction to measure such crystal defects 20d, some dislocations may not appear in the double-refraction image or point defects that are not structure defects may appear in the double-refraction image. Hence, the X-ray topography is more preferable than the double-refraction method.

In single-crystal diamond 20 of the present embodiment, the density of crystal defect points 20dp is preferably more than 2 mm$^{-2}$, is more preferably more than 20 mm$^{-2}$, is still more preferably more than 300 mm$^{-2}$, is further preferably more than 1000 mm$^{-2}$, and is particularly preferably more than $1\times10^4$ mm$^{-2}$. Since the density of crystal defect points 20dp is more than 2 mm$^{-2}$ in such a single-crystal diamond material, occurrence of large chipping is suppressed due to stress relaxation provided by the high density of the crystal defect lines corresponding to the high density of the crystal defect points. Particularly, chipping resistance is particularly excellent when the density of crystal defect points 20dp is more than 1000 mm$^{-2}$.

In single-crystal diamond material 20 of the present embodiment, the density of the combined dislocation points of crystal defect points 20dp is preferably more than 2 mm$^{-2}$, is more preferably more than 30 mm$^{-2}$, is further preferably more than 300 mm$^{-2}$, and is particularly preferably more than 3000 mm$^{-2}$. Each of the combined dislocation points is a tip point of a combined dislocation reaching the crystal growth main surface, the combined dislocation resulting from a combination of at least either of a plurality of edge dislocations and a plurality of screw dislocations. Since the density of the combined dislocation points, which are the tip points of the combined dislocations reaching the crystal growth main surface, is more than 20 mm$^{-2}$ and the effect of stress relaxation provided by the combined dislocations is large in such a single-crystal diamond material, occurrence of large chipping is suppressed further. Particularly, chipping resistance is particularly excellent when the density of the combined dislocation points is more than 300 mm$^{-2}$.

Here, the combined dislocations can be observed by changing an X-ray diffraction direction (g vector) in the X-ray topography. For example, when observing, in the transmission type, the (001) plane that is a crystal plane of the diamond single crystal, the edge dislocations can be observed in a g vector of a [440] direction and cannot be observed in a g vector of a [4-40] direction or the like orthogonal to the foregoing g vector, whereas the combined dislocations can be observed in a plurality of g vectors of the [440] direction, the [4-40] direction, and the like orthogonal to one another. It should be noted that when observing other dislocations having a Burgers vector that is not perpendicular to the <001> direction, in which the dislocations, i.e., the crystal defect lines extend and that has a component also in the <001> direction, such dislocations can be observed in the reflection type in g vectors of the [044] direction, the [004] direction, the [111] direction, the [113] direction, and the like, for example. However, in the case of the reflection type, the crystal defect lines such as the dislocations are overlapped with one another in the image, with the result that it becomes difficult to discern whether or not the crystal defects are in the form of the structure of the present invention. Since the combined dislocations thus observed are also crystal defect lines, the density of the combined dislocations can be measured in the same manner as the measurement for the density of the crystal defect lines.

With reference to FIG. 3, single-crystal diamond material 20 of the present embodiment preferably include a plurality of single-crystal diamond layers 21, 22. Since the single-crystal diamond material includes the plurality of single-crystal diamond layers 21, 22, occurrence of large chipping is further suppressed.

With reference to FIG. 3, first single-crystal diamond layer 21 is grown by CVD (chemical vapor deposition) on a main surface 10m of a diamond seed crystal 10 having seed crystal defect line-like gathered regions in which groups of seed crystal defect points 10dp are gathered to extend in the form of lines at main surface 10m, and crystal defect lines 21dq transferred from the defects of seed crystal defect points 10dp at main surface 10m extend in first single-crystal diamond layer 21 in the crystal growth direction. In second single-crystal diamond layer 22 grown by CVD on first single-crystal diamond layer 21, crystal defect points 20dp are tip points of crystal defect lines 22dq that have defects transferred from defects of crystal defect lines 21dq and that extend in the crystal growth direction to reach crystal growth main surface 20m of single-crystal diamond material 20.

On this occasion, generally, in first single-crystal diamond layer 21, a plurality of crystal defect lines 21dq are transferred from one seed crystal defect point 10dp of diamond seed crystal 10, and in second single-crystal diamond layer 22, a plurality of crystal defect lines 22dq are transferred from one crystal defect line 21dq of first single-crystal diamond layer 21. Hence, as the number of single-crystal diamond layers 21, 22 is increased, the number of crystal defect points 20dp of single-crystal diamond material 20 is increased. As a result, the structure becomes such that as the number of single-crystal diamond layers 21, 22 is increased, the number of crystal defect lines 21dq, 22dq from main surface 20n opposite to crystal growth main surface 20m toward crystal growth main surface 20m is increased, thereby obtaining a crystal having higher chipping resistance.

Preferably in single-crystal diamond material 20 of the present embodiment, crystal defect lines 21dq, 22dq are newly generated or branched at interface 212i between single-crystal diamond layers 21, 22, and the density of crystal defect points 20dp of crystal growth main surface 20m is higher than the density of the crystal defect points of main surface 20n opposite to crystal growth main surface 20m. According to such a single-crystal diamond material, occurrence of large chipping is suppressed further.

With reference to FIG. 1, preferably in single-crystal diamond material 20 of the embodiment, in an X-ray topography image for a certain main surface (for example, crystal growth main surface 20m), a plurality of crystal defect line-like gathered regions 20r exist in parallel, and in each of crystal defect line-like gathered regions 20r, groups of crystal defect points 20dp are gathered to extend in the form of lines, each of crystal defect points 20dp being a tip point of a crystal defect line 20dq reaching at least one surface (for example, crystal growth main surface 20m) of single-crystal diamond material 20, crystal defect line 20dq representing a line in which crystal defect 20d exists. Occurrence of large chipping is suppressed in the single-crystal diamond material. Here, the form of lines can be determined based on an abrupt decrease of probability of existence of crystal defect points 20dp on a line rotated by a certain angle φ (for example, not less than 10° and not more than 90°) from one fixed line having a certain width as compared with probability of existence of crystal defect points 20dp on the fixed line. That is, when at least five lines are extracted and angles and crystal defect points on lines are plotted in a graph, a peak appears with the fixed line being centered, thereby determining the form of lines.

Here, crystal defect line-like gathered regions 20r each have a length L, and have an interval D in the direction in which they extends in the form of lines. Moreover, the plurality of crystal defect line-like gathered regions 20r exist in parallel with each other at a pitch P. A larger length L of crystal defect line-like gathered region 20r is more preferable. Length L of crystal defect line-like gathered region 20r is preferably not less than 300 μm, and is more preferably not less than 500 μm. A smaller interval D between crystal defect line-like gathered regions 20r is more preferable. Interval D is preferably not more than 500 μm and is more preferably not more than 250 μm. A smaller pitch P between crystal defect line-like gathered regions 20r is more preferable. Pitch P is preferably not more than 500 μm, and is more preferably not more than 250 μm. Moreover, pitch P may not be constant. Moreover, the direction in which crystal defect line-like gathered regions 20r extends in the form of lines refers to an average of directions in which the plurality of crystal defect line-like gathered regions 20r extend in the form of lines. The direction in which each crystal defect line-like gathered region 20r extends in the form of a line preferably forms an angle θ of not more than 30° relative to the average of the directions.

In single-crystal diamond material 20 of the present embodiment, the concentration of the non-substitutional nitrogen atoms is preferably not less than 1 ppm, is more preferably not less than 3 ppm, is still more preferably not less than 5 ppm, is further preferably not less than 8 ppm, is still further preferably not less than 10 ppm, and is particularly preferably not less than 30 ppm. Since the non-substitutional nitrogen atoms in single-crystal diamond material 20 are joined to crystal defect lines 20dq, occurrence of large chipping in single-crystal diamond material 20 is suppressed, thus increasing chipping resistance. Particularly, when the concentration of the non-substitutional nitrogen atoms is not less than 10 ppm, excellent chipping resistance is exhibited. When groups of crystal defect points 20dp are gathered, a larger amount of non-substitutional nitrogen is more likely to be formed in the diamond to provide high chipping resistance. The concentration of such non-substitutional nitrogen atoms can be calculated by subtracting the concentration of the substitutional nitrogen atoms measured by ESR (electron spin resonance method) from the concentration of all the nitrogen atoms measured by SIMS (secondary ion mass spectrometry method).

In single-crystal diamond 20 of the present embodiment, a transmittance for light having a wavelength of 400 nm when the thickness of single-crystal diamond material 20 is 500 μm is preferably not more than 60%, is more preferably not more than 30%, and is further preferably not more than 10%, and is particularly preferably not more than 5%. Further, a transmittance for light having a wavelength of 600 nm when the thickness of single-crystal diamond material 20 is 500 μm is preferably not more than 60%, is more preferably not more than 30%, and is further preferably not more than 10%, and is particularly preferably not more than 5%. When the transmittance for light having a wavelength of 400 nm is small, there are a multiplicity of crystal defect lines in the single-crystal diamond material of the present embodiment and there are also a large amount of non-substitutional nitrogen in the single-crystal diamond material of the present embodiment, whereby crack is suppressed and chipping resistance is exhibited. When a transmittance for light having a longer wavelength of 600 nm is small, there are a multiplicity of crystal defect lines in the single-crystal diamond material of the present embodiment and there are also a large amount of non-substitutional nitrogen in the single-crystal diamond material of the present embodiment, whereby crack is suppressed and chipping resistance is exhibited. Only with such a multiplicity of crystal defect lines, the transmittance for light does not necessarily have a large influence; however, when the non-substitutional nitrogen is combined with the crystal defect lines (such that the non-substitutional nitrogen enters a space between crystal defect lines and the crystal defect lines extend between the nitrogen atoms), the non-substitutional nitrogen and the crystal defect lines are synergically increased and a sp2 component of carbon therearound is increased slightly, thus affecting the transmittance for light. The crystal defect lines and the non-substitutional nitrogen thus combined have an influence to prevent spread of crack and chipping. Hence, the transmittance for light in that case serves as a good index for chipping resistance.

Here, the "transmittance for light" refers to a substantial transmittance for incoming light, rather than a transmittance therein excluding reflectance. Hence, even when there is no absorption or scattering, the transmittance will be about 71% at maximum. A converted value of transmittance in the case of a different thickness can be obtained using a generally known formula in consideration of multiple reflections therein. Moreover, the "transmittance for light when the thickness of the single-crystal diamond material is 500 μm" refers to a transmittance for light measured when the thickness thereof is 500 μm, or a transmittance of light obtained by measuring a transmittance of light measured when the thickness thereof is not 500 μm and converting the measured transmittance into a transmittance when the thickness is 500 μm.

Second Embodiment: Single-Crystal Diamond Chip

In a single-crystal diamond chip according to the present embodiment, a concentration of non-substitutional nitrogen atoms is not more than 200 ppm, a concentration of substitutional nitrogen atoms is lower than the concentration of the non-substitutional nitrogen atoms, and the single-crystal diamond chip has a main surface with an off angle of not more than 20°. With such a single-crystal diamond chip, small wear rate variation is achieved. Generally, a single-crystal diamond chip is advantageous in production in the following point: the single-crystal diamond chip is obtained by cutting the single-crystal diamond material perpendicularly to the main surface thereof and values of off angles at both sides are the same. However, a main surface of a single-crystal diamond material generally has a large off angle due to suppression of poly-crystallization or the like in the synthesis. Therefore, even when the off angle of the main surface is large, in order to reduce wear rate variation, it is effective to cut a single-crystal diamond chip out from the single-crystal diamond material obliquely by the off angle such that the off angle of the main surface of the single-crystal diamond chip becomes not more than 20°. In view of this, the off angle of the main surface is preferably less than 10°, is more preferably less than 7°, is still more preferably less than 5°, is further preferably less than 3°, and is particularly preferably less than 1°.

The off angle variation among the single-crystal diamond chips depends on the off angle variation among the single-crystal diamond materials. A smaller off angle of the single-crystal diamond material is more preferable because the off angle of the single-crystal diamond chip can be more likely to be reduced when the off angle of the single-crystal diamond material is smaller. Moreover, the variation is more likely to be reduced as described above when a difference is smaller (for example, not more than) 5° between the off angle of the crystal growth main surface of the single-crystal diamond material (or the crystal growth main surface at the initial stage of the growth) and the off angle of the main surface of the single-crystal diamond chip. When the difference is more than 5°, the variation tends to be increased to exceed an off angle of 10°. However, finally, wear variation among final products more depends on the off angle of the main surface of the single-crystal diamond chip as compared with the off angle of the crystal growth main surface of the single-crystal diamond material. Therefore, the off angle of the main surface of the single-crystal diamond chip takes precedence over the off angle of single-crystal diamond material. Here, the main surface of the single-crystal diamond chip refers to a surface mainly performing a function as a tool when mounted on the tool irrespective of its size. For example, in the case of a perforated tool, the main surface is a main surface supposed to perform perforation. In the case of a cutting tool, the main surface is a main surface supposed to serve as a cutting face.

However, when it is difficult to specify a tool, the main surface is based on the following definition. The main surface of the single-crystal diamond chip refers to a surface having a higher symmetry, rather than a surface having the maximum area. In the case of a cylinder, the main surface is a circular surface. In the case of a rectangular parallelepiped or a quadrangular prism, the main surface is a surface closer to a square. When each of the surfaces is close to a square within an error of 8%, the main surface is each of a pair of surfaces having a higher degree of parallelization. In the case of a cube, any surface can be assumed as the main surface because the crystal structure of the diamond is a face-centered cubic structure and the off angle is therefore the same for all the surfaces.

Moreover, the single-crystal diamond chip according to the present embodiment is cut out from the single-crystal diamond of the first embodiment. Therefore, the single-crystal diamond chip according to the present embodiment refers to each of single-crystal diamond chips having substantially polygonal prism shapes (having substantially polygonal main surfaces), such as a single-crystal diamond chip having a substantially quadrangular prism shape, a substantially square prism shape, a substantially rectangular parallelepiped shape, or a substantially cubic shape, or refers to each of single-crystal diamond chips having substantially cylindrical shapes (having substantially circular main surfaces). The term "substantially" is used to indicate a shape that can be seen so when viewed by eyes, rather than a strict, precise shape. Precision is expected to be about less than ±10%. Therefore, the off angle of the single-crystal diamond material is not necessarily equal to the off angle of the single-crystal diamond chip. Moreover, basically, the single-crystal diamond chip is preferably translationally symmetrically cut out from the single-crystal diamond material in order to use the material efficiently. With such a single-crystal diamond chip, smaller wear rate variation is achieved.

The single-crystal diamond chip of the present embodiment is produced by cutting the single-crystal diamond material; however, the off angle and the like uniform in the single-crystal diamond material will be varied when just cutting it. Therefore, it is preferable to use a laser having a degree of parallelization of not more than 2°. The degree of parallelization of such a laser is more preferably not more than 1°, is further preferably not more than 0.5°, and is particularly preferably not more than 0.2°. The degree of parallelization is attained by a contrivance such as modification of an optical system by taking a precedence over focal depth. By employing such a fact that the laser provides a wedge-shaped cut shape, control for ¼ of the angle (0.05°) can be further attained by changing the cutting direction for the sides facing each other. With such a technique, the off angle of the main surface of the single-crystal diamond chip can be controlled to be a less varied angle.

Furthermore, a single-crystal diamond chip having a highly symmetrical shape such as a cubic shape is not suitable because a surface to be used is not distinguishable. A rectangular parallelepiped shape or a shape having different height, width, and length is preferable because a surface to be used is distinguishable. However, a cubic shape or rectangular parallelepiped shape provided with a mark is preferable because a surface to be used is distinguishable. The cutting by the laser may be performed perpendicular or oblique to a surface or perpendicular or oblique to a side as long as the degree of parallelization is attained. With these contrivances, the single-crystal diamond chip can be produced in which the nitrogen atom concentration and the off angle are controlled.

In the single-crystal diamond chip of the present embodiment, the main surface of the single-crystal diamond chip is preferably a low-index plane represented by a Miller index of not less than −5 and not more than 5 in an integer. With such a single-crystal diamond chip, smaller wear rate variation is achieved. Here, in view of the above, the low-index plane is at least one plane having a plane orientation selected from a group consisting of {100}, {110}, {111}, {211}, {311}, and {331}.

Preferably in the single-crystal diamond chip of the present embodiment, in an X-ray topography image for one of the crystal growth main surface and the main surface parallel to the crystal growth main surface (this main surface is a main surface formed by cutting the single-crystal diamond material; the same applies to the description below), groups of crystal defect points are gathered, each of the crystal defect points being a tip point of a crystal defect line reaching one of the crystal growth main surface and the main surface parallel to the crystal growth main surface, the crystal defect line representing a line in which a crystal defect exists, and the density of the crystal defect points is more than 2 $mm^{-2}$. Occurrence of large chipping is suppressed in the single-crystal diamond chip. Moreover, the crystal growth main surface and the main surface parallel to the crystal growth main surface of the single-crystal diamond chip are not particularly limited but are preferably parallel or perpendicular to the main surface of the single-crystal diamond chip in order to suppress occurrence of large chipping of the single-crystal diamond chip.

In the single-crystal diamond chip of the present embodiment, a transmittance for light having a wavelength of 400 nm when the thickness of the single-crystal diamond chip is 500 μm is preferably not more than 60%, is more preferably not more than 30%, and is further preferably not more than 10%, and is particularly preferably not more than 5%. Further, a transmittance for light having a wavelength of 600 nm when the thickness of single-crystal diamond material 20 is 500 μm is preferably not more than 60%, is more preferably not more than 30%, and is further preferably not more than 10%, and is particularly preferably not more than 5%. When the transmittance for light having each of these wavelengths is small, there are a multiplicity of crystal defect lines in the single-crystal diamond material of the present embodiment and there are also a large amount of non-substitutional nitrogen in the single-crystal diamond material of the present embodiment, whereby crack is suppressed and chipping resistance is exhibited. Here, since the single-crystal diamond chip is made smaller than the single-crystal diamond material, it is effective to perform measurement using a spectrophotometer of a general microscope. An entrance surface and an exit surface for light are preferably polished optically evenly in order to avoid scattering at the surfaces as much as possible.

Third Embodiment: Perforated Tool

In a perforated tool including a single-crystal diamond die according to the present embodiment, in the single-crystal diamond die, a concentration of non-substitutional nitrogen atoms is not more than 200 ppm, a concentration of substitutional nitrogen atoms is lower than the concentration of the non-substitutional nitrogen atoms, the single-crystal die has a low-index plane represented by a Miller index of not less than −5 and not more than 5 in an integer, and an off angle of a perpendicular line of the low-index plane is not more than 20° relative to an orientation of a hole for wire drawing. With such a perforated tool, occurrence of large chipping in the single-crystal diamond die is suppressed while achieving small wear rate variation.

Moreover, the perforated tool according to the present embodiment includes the single-crystal diamond die formed from the single-crystal diamond chip of the second embodiment. According to such a perforated tool, small wear rate variation among single-crystal diamond dies is achieved.

The single-crystal diamond die included in the perforated tool of the present embodiment is produced from the single-crystal diamond chip of the second embodiment. Since the single-crystal diamond chip has at least one or more flat surfaces, a hole for wire drawing in a certain direction can be formed based on the surface(s) as a reference when producing the perforated tool (here, each of the reference surfaces is basically a main surface of the single-crystal diamond chip; however, a hole may be formed in a surface different from the surface defined as the main surface of the single-crystal diamond chip). For example, the flat surface is aligned with a surface on which the single-crystal diamond chip is placed when producing the die. When the surface is varied, holes of perforated tools are varied with respect to the plane orientation. Based on the rectangular parallelepiped shape, an inappropriate surface is avoided from being set. Although the shape is preferably of different length, width, and length, a rectangular parallelepiped shape including a square or a cubic shape can be used if it is not mistaken by providing a mark (a point provided by a laser or a graphite layer surface). According to the above method, the single-crystal diamond die can be produced from the single-crystal diamond chip in which the nitrogen atom concentration and the off angle of the main surface are controlled.

Preferably in the perforated tool of the present embodiment, in an X-ray topography image for the crystal growth main surface of the single-crystal diamond die, groups of crystal defect points are gathered, each of the crystal defect points being a tip point of a crystal defect line reaching the crystal growth main surface, the crystal defect line representing a line in which a crystal defect exists, and a density of the crystal defect points is more than 2 mm$^{-2}$. In such a perforated tool, occurrence of large chipping of the single-crystal diamond die is suppressed. Moreover, the crystal growth main surface of the single-crystal diamond die is not particularly limited but is preferably parallel or perpendicular to the direction of the hole of the single-crystal diamond die in order to suppress occurrence of the large chipping of the single-crystal diamond die.

In the perforated tool of the present embodiment, a density of combined dislocation points of the crystal defect points is preferably more than 2 mm$^{-2}$, each of the combined dislocation points being a tip point of a combined dislocation reaching the crystal growth main surface, the combined dislocation resulting from a combination of at least either of a plurality of edge dislocations and a plurality of screw dislocations. In such a perforated tool, occurrence of large chipping of the single-crystal diamond die is suppressed.

Preferably in the perforated tool of the present embodiment, the single-crystal diamond die includes a plurality of single-crystal diamond layers, a crystal defect line is newly generated or branched at an interface between the single-crystal diamond layers, and the density of the crystal defect points in the crystal growth main surface is higher than the density of the crystal defect points of the main surface opposite to the crystal growth main surface. According to such a perforated tool, occurrence of large chipping of the single-crystal diamond die is suppressed.

Preferably in the perforated tool of the present embodiment, a plurality of crystal defect line-like gathered regions exist in parallel in the single-crystal diamond die, and in each of the plurality of crystal defect line-like gathered regions, groups of the crystal defect points are gathered to extend in the form of lines. According to such a perforated tool, occurrence of large chipping of the single-crystal diamond die is suppressed.

Preferably in the perforated tool of the present embodiment, the concentration of the non-substitutional nitrogen atoms is not less than 1 ppm in the single-crystal diamond die. According to such a perforated tool, occurrence of large chipping of the single-crystal diamond die is suppressed.

In the perforated tool of the present embodiment, in the single-crystal diamond die, a transmittance for light having a wavelength of 400 nm when the single-crystal diamond die has a thickness of 500 μm is preferably not more than 60%, is more preferably not more than 30%, is further preferably not more than 10%, and is particularly preferably not more than 5%. Furthermore, a transmittance for light having a wavelength of 600 nm is preferably not more than 60%, is more preferably not more than 30%, is further preferably not more than 10%, and is particularly preferably not more than 5%. According to such a perforated tool, occurrence of large chipping of the single-crystal diamond die is suppressed.

Fourth Embodiment: Method of Producing Single-Crystal Diamond Material

With reference to FIG. 4, a method of producing single-crystal diamond material 20 of the present embodiment includes: a step (FIG. 4 (A)) of preparing diamond seed crystal 10 having seed crystal defect gathered regions in which seed crystal defect points 10$dp$ are gathered at main surface 10$m$; and a step (FIG. 4 (B)) of growing single-crystal diamond material 20 by chemical vapor deposition on main surface 10$m$ of diamond seed crystal 10. Seed crystal defect point 10$dp$ refers to a seed crystal defect point 10$dp$ at main surface 10$m$ of diamond seed crystal 10. The seed crystal defect gathered region refers to a region in which crystal defect points are gathered at main surface 10$m$ of diamond seed crystal 10. In the seed crystal defect gathered region at main surface 10$m$ of diamond seed crystal 10, groups of seed crystal defect points 10$dp$ are more preferably gathered, seed crystal defect points 10$dp$ are further preferably gathered to extend in the form of lines, and seed crystal defect points 10$dp$ are particularly preferably seed crystal defect line-like gathered regions, in which groups of seed crystal defect points 10$dp$ are gathered to extend in the form of lines.

In the method of producing single-crystal diamond 20 of the present embodiment, seed crystal defect points 10$dp$, the seed crystal defect gathered region, and the seed crystal defect line-like gathered region are shown suitably in an X-ray topography image measured in the transmission type in the direction perpendicular to main surface 10$m$ of diamond seed crystal 10 (i.e., X-ray topography image for main surface 10$m$ of diamond seed crystal 10).

(Step of Preparing Diamond Seed Crystal Having Seed Crystal Defect Gathered Regions)

With reference to FIG. 4 (A), the step of preparing diamond seed crystal 10 having seed crystal defect gathered regions in which seed crystal defect points 10$dp$ are gathered at main surface 10$m$ of diamond seed crystal 10 is not particularly limited; however, in order to effectively prepare diamond seed crystal 10 having seed crystal defect line-like gathered regions in which groups of seed crystal defect points 10$dp$ are gathered to extend in a form of lines at main surface 10$m$ of diamond seed crystal 10, the step can includes: a sub step of preparing diamond seed crystal 10; a sub step of forming the seed crystal defect gathered region in which seed crystal defect points 10$dp$ are gathered at main surface 10m of diamond seed crystal 10; and a sub step of forming a conductive layer region 10c at main surface 10m of diamond seed crystal 10 by implanting ions to break and convert the diamond into graphite in the ion implantation region.

In the sub step of preparing diamond seed crystal 10, as diamond seed crystal 10, there is prepared a type Ib single-crystal diamond or type IIa single-crystal diamond grown by the HPHT (high-pressure/high-temperature) method, or a single-crystal diamond grown by CVD using the type Ib single-crystal diamond or the type IIa single-crystal diamond as a seed crystal.

In the sub step of forming the seed crystal defect gathered regions in which seed crystal defect points 10dp are gathered at main surface 10m of diamond seed crystal 10, various types of defect points are included in seed crystal defect points 10dp, such as seed crystal defect points, seed crystal dislocation points 10dd (tip points of dislocations reaching main surface 10m, such as edge dislocations, screw dislocations, and combined dislocations resulting from combinations of at least either of a plurality of edge dislocations and a plurality of screw dislocations), seed crystal chipping points 10dv, seed crystal cracking points, and seed crystal damage points 10di. Moreover, the seed crystal defect gathered region is preferably formed by performing mechanical polishing using a grindstone at a rotation speed of 500 rpm to 3000 rpm and a load of 0.5 kgf to 50 kgf, for example. In the grindstone, diamond abrasive grains having an average grain size of 9 μm to 35 μm are fixed using a metal. The seed crystal defect points are more readily formed in the main surface of the seed crystal as the average grain size is larger, the rotation speed is larger, and the load is larger. The load falls within the range of 0.5 kgf to 50 kgf. The load is preferably not less than 0.5 kgf, is more preferably not less than 5 kgf, is further preferably not less than 10 kgf, and is particularly preferably not less than 20 kgf.

As the load is larger, a mechanism for suppressing vibration is necessary in order to avoid breakage of a substrate. On the other hand, a high frequency of vibration is permitted. This leads to generation of minute cracks at the surface of diamond seed crystal 10, thus contributing to forming starting points of the groups of seed crystal defect points 10dp. When diamond seed crystal 10 is rotated in the polishing direction, seed crystal defect points 10dp are more likely to be formed to be gathered. On the other hand, when diamond seed crystal 10 is fixed, seed crystal defect points 10dp are more likely to be formed to be gathered in the form of lines. Since the diamond seed crystal is broken readily when the load is large, the thickness of the diamond seed crystal needs to be increased with respect to the size of the diamond seed crystal. For the thickness of the diamond seed crystal with respect to the size of the diamond seed crystal, a thickness of not less than 0.8 mm with respect to a square of 4 mm is preferable when the load is not less than 0.5 kgf and less than 5 kgf, a thickness of not less than 1.6 mm with respect to a square of 4 mm is preferable when the load is not less than 5 kgf and less than 20 kgf, and a thickness of not less than 3.2 mm with respect to a square of 4 mm is preferable when the load is not less than 20 kgf. By increasing slowly and carefully a load increase rate when applying the load, the diamond seed crystal can be polished without being broken even if it is out of the above range; however, this is time consuming. By also performing reactive ion etching (ME), microwave plasma etching, ion milling, or the like after the mechanical polishing, the density of the generated seed crystal defect points can be finely adjusted and the effect thereof is substantially maintained.

Moreover, a minute crack can be formed at a location where diamond grown from the left and diamond grown from the right hit each other when synthesizing diamond to fill a groove formed in the diamond using photolithography and etching technique or using a laser. However, it is preferable that the direction of the off angle and the direction of the groove are parallel to each other in a range of ±10°. If the direction of the off angle and the direction of the groove are not parallel to each other in the above range, particularly, if they are almost perpendicular to each other, the groove is completely filled and disappears, with the result that the minute crack providing the effect of the present invention is not obtained. In this case, even if reactive ion etching, plasma etching, or ion milling is performed up to the depth of the formed groove in order to form the minute crack, the effect of the present invention cannot be obtained.

The sub step of forming conductive layer region 10c at the main surface 10m side of diamond seed crystal 10 can be performed by implanting ions into the main surface 10m side of diamond seed crystal 10 to form an ion implantation region. For the ions to be implanted, carbon ions, nitrogen ions, silicon ions, or phosphorus ions are used preferably.

(Step of Growing Single-Crystal Diamond Material)

With reference to FIG. 4 (B), the step of growing single-crystal diamond material 20 is performed by growing single-crystal diamond material 20 on main surface 10m of diamond seed crystal 10 by CVD (chemical vapor deposition). As the CVD, microwave plasma CVD, DC plasma CVD, hot filament CVD, and the like are used suitably. For gases for single-crystal growth, hydrogen, methane, argon, nitrogen, oxygen, carbon dioxide, and the like are used to adjust the concentration of the non-substitutional nitrogen atoms (the concentration obtained by subtracting the concentration of the substitutional nitrogen atoms from the concentration of all the nitrogen atoms) in the single-crystal diamond material to be preferably not less than 1 ppm, more preferably not less than 3 ppm, still more preferably not less than 5 ppm, further preferably not less than 8 ppm, still further preferably not less than 10 ppm, or particularly preferably not less than 30 ppm. Further, a doping gas may be added, such as diborane, trimethylboron, phosphine, tertiary butylphosphorus, or silane. The crystal growth main surface of single-crystal diamond material 20 preferably has a plane orientation of (100). In a region in which the thickness of single-crystal diamond material 20 is 1 μm to 7 μm at the initial stage of the crystal growth, it is preferable to grow it under conditions that at least a growth parameter ($\alpha$) is not less than 2 and the temperature of diamond seed crystal 10 is not more than 1100° C. The growth parameter ($\alpha$) herein refers to a value obtained by multiplying, by square root of 3, a ratio of the rate of crystal growth in the <100> direction to the rate of crystal growth in the <111> direction.

The thickness of single-crystal diamond material 20 to be grown is not particularly limited but is preferably not less than 300 μm and is more preferably not less than 500 μm in order to suitably form a cutting tool, a polishing tool, an optical component, an electronic component, a semiconductor material, and the like. The thickness of single-crystal diamond 20 is preferably not more than 3 mm and is more preferably not more than 1.5 mm in order to prevent cracks from being generated due to stress with diamond seed crystal 10. In the case of growing single-crystal diamond material 20 having a thickness of more than 1 mm, it is preferable to grow second single-crystal diamond layer 22 on first single-crystal diamond layer 21 as an additional single-crystal diamond material 20 after growing first single-crystal diamond layer 21 having a thickness of not more than 500 μm and then removing diamond seed crystal 10 as described below.

It should be noted that in the case of growing single-crystal diamond material 20 including the plurality of single-crystal diamond layers 21, 22 as shown in FIG. 3, first single-crystal diamond layer 21 and second single-crystal diamond layer 22 can be continuously grown on diamond seed crystal 10 as single-crystal diamond material 20. However, in the case of growing single-crystal diamond material 20 having a large thickness (for example, thickness of more than 1 mm), it is preferable that first single-crystal diamond layer 21 having a thickness of not more than 500 μm is grown, then the diamond seed crystal is removed, and then second single-crystal diamond layer 22 is additionally grown, in order to prevent diamond seed crystal 10 from being broken due to stress resulting from the large thickness of single-crystal diamond material 20. Between the formation of first single-crystal diamond layer 21 and the formation of second single-crystal diamond layer 22, the environment is returned from a growth environment to a normal atmosphere at a room temperature and then is changed to the growth environment again. Accordingly, the crystal defect lines previously formed in the present invention are more likely to be branched, thus increasing the crystal defect points. Meanwhile, the above-described mechanical polishing can also be performed onto the crystal growth main surface of first single-crystal diamond layer 21. In that case, first single-crystal diamond layer 21 serves as a new seed substrate to become a diamond seed crystal 10 shown in FIG. 3, thereby achieving growth with increased number of initial start points.

(Step of Removing Diamond Seed Crystal)

With reference to FIG. 4 (C), in order to obtain single-crystal diamond material 20 efficiently, the method of producing single-crystal diamond material 20 of the present embodiment can further include a step of removing diamond seed crystal 10.

In order to remove diamond seed crystal 10 efficiently, in the step of removing diamond seed crystal 10, it is preferable to remove diamond seed crystal 10 by performing electrochemical etching such as electrolytic etching to decompose and remove conductive layer region 10c that is the ion implantation region formed by performing ion implantation into diamond seed crystal 10.

(Step of Additionally Growing Single-Crystal Diamond Material)

With reference to FIG. 4 (D), in order to obtain single-crystal diamond material 20 in which occurrence of large chipping is further suppressed, the method of producing single-crystal diamond material 20 in the present embodiment can further include a step of additionally growing a single-crystal diamond material 20.

The step of additionally growing single-crystal diamond material 20 is performed by growing second single-crystal diamond layer 22 by CVD on the main surface of first single-crystal diamond layer 21, which is single-crystal diamond material 20 having been already grown. In first single-crystal diamond layer 21, crystal defect lines 21dq having defects transferred from seed crystal defect points 10dp of main surface 10m of diamond seed crystal 10 extend in the crystal growth direction as shown in FIG. 4 (C). In second single-crystal diamond layer 22 grown by CVD on first single-crystal diamond layer 21, crystal defect points 20dp are tip points of crystal defect lines 22dq that have defects transferred from crystal defect lines 21dq and that extend in the crystal growth direction to reach crystal growth main surface 20m of single-crystal diamond material 20.

On this occasion, generally, in first single-crystal diamond layer 21, a plurality of crystal defect lines 21dq are transferred from one seed crystal defect point 10dp of diamond seed crystal 10, and in second single-crystal diamond layer 22, a plurality of crystal defect lines 22dq are transferred from one crystal defect line 21dq of diamond seed crystal 10. Hence, as the number of single-crystal diamond layers 21, 22 is increased, the number of crystal defect points 20dp of single-crystal diamond material 20 is increased, thereby further suppressing occurrence of large chipping.

EXAMPLES

Example 1

(Production of Samples)
1. Preparation of Diamond Seed Crystal

With reference to FIG. 4 (A), each of type Ib single-crystal diamonds was prepared as diamond seed crystal 10. The type Ib single-crystal diamond was grown by the HPHT (high-pressure/high-temperature) method and had a main surface with an off angle of 2° relative to a (001) plane in the <100> direction. The type Ib single-crystal diamond had a size of 4 mm×4 mm and had a thickness shown in Table 1.

The main surface of each of diamond seed crystals 10 was polished using a grindstone at a rotation speed of 500 rpm to 3000 rpm under a load shown in Table 1 (specifically, 10 kgf to 20 kgf or 0.5 kgf to 5 kgf). In the grindstone, diamond abrasive grains having an average grain size of 9 μm to 35 μm are fixed by a metal. Here, for the polishing, attention was paid to selection of polishing directions, and therefore Table 1 shows the polishing directions distinctively. "Fixation" in Table 1 indicates a general polishing method (with a small load) in which the single-crystal diamond material is fixed and polished such that a grinder moves in a direction in which the polishing is relatively readily performed (for example, substantially the <100> direction relative to the (100) plane). "Rotation→Fixation" indicates a method in which a substrate made relatively flat by a general method is polished for 2 hours while being rotated (turned) and then is fixed and polished for 1 hour. With this, defects are likely to be introduced in the form of lines. The load during the polishing in Table 1 is a load in the case of "Fixation" or "Rotation→Fixation". Thus, as the seed crystal defect line-like gathered regions in which crystal defect points were gathered in the form of lines, scratches were formed to extend in the <100> direction in the form of lines in each of Example 1-1 to Example 1-3, whereas scratches with interspersed crystal defect points were formed in each of Example 1-4 and Example 1-5. Here, the load was applied in the following manner: the load was gradually increased at a rate of not more than 3 kgf/min while using an apparatus having a mechanism for suppressing vibration of the grindstone not to exceed 110% of the maximum value of the above range of the load.

Next, the densities of seed crystal defect points 10dp and seed crystal damage points 10di were adjusted by dry-etching the main surface of the diamond seed crystal using oxygen ($O_2$) gas and carbon tetrafluoride ($CF_4$) gas. It should be noted that the average grain size refers to an average grain size designated by a manufacturer that supplies a diamond grinder, and the average grain size herein refers to an average particle size in the specification of a grinder provided by International Diamond Inc. Such an average grain size is generally determined by screening grains using a sieve. An average grain size of 35 µm to 9 µm corresponds to grain sizes screened by a sieve of #600 to #1500 (sieve of 600 to 1500 per inch).

Furthermore, in each of Example 1-2, Example 1-3, and Example 1-5, photolithography was employed to form grooves each having an aspect ratio of 2, a groove width of 3 µm, and a groove interval of 200 µm as shown in Table 1, and then CVD growth was performed without adding nitrogen.

Next, carbon ions were implanted into main surface $10m$ of each diamond seed crystal 10 with an energy of 300 keV to 10 MeV at an dose amount of $1 \times 10^{15}$ cm$^{-2}$ to $1 \times 10^{18}$ cm$^{-2}$, thereby forming conductive layer region $10c$. This step was performed when removing the single-crystal diamond material, grown through vapor phase method, from the diamond seed crystal by electrolytic etching. This step was omitted in the case where the diamond would be sliced by a laser in a subsequent step.

2. Formation of Single-Crystal Diamond Material

Next, with reference to FIG. 4 (B), microwave plasma CVD (chemical vapor deposition) was employed to grow single-crystal diamond 20 on main surface $10m$ of each diamond seed crystal 10 provided with the seed crystal defect line-like gathered regions. For crystal growth gases, hydrogen (H$_2$) gas, methane (CH$_4$) gas, and nitrogen (N$_2$) gas were used. The concentration of the CH$_4$ gas relative to the H$_2$ gas was set at 5 mol % to 20 mol %, and the concentration of the N$_2$ gas relative to the CH$_4$ gas was set at 0 mol % to 5 mol %. A crystal growth pressure was set at 5 kPa to 15 kPa, and a crystal growth temperature (temperature of the diamond seed crystal) was set at 800° C. to 1200° C.

3. Removal of Diamond Seed Crystal

Next, with reference to FIG. 4 (C) and FIG. 4 (D), respective single-crystal diamond materials 20 were removed from diamond seed crystals 10 by performing electrolytic etching to decompose the conductive layer regions in the diamond seed crystals. Alternatively, in the case where no ion implantation had been performed, slicing was performed using a laser to remove them from the diamond seed crystals. The removed-side surface (main surface opposite to the crystal growth main surface) of each single-crystal diamond material obtained by the ion implantation and the subsequent electrolytic etching had an undulation with a maximum height difference Dm of not more than 1 µm/mm and an arithmetic mean roughness Ra of not more than 10 nm, which were measured using a white scan type white interference type microscope (ZYGO provided by Canon). In the case where the single-crystal diamond material was sliced using a laser, the single-crystal diamond material needed to be polished after the removal. The polished, removed-side surface (main surface opposite to the crystal growth main surface) of the single-crystal diamond material had an undulation having a maximum height difference Dm of not more than 1 µm/mm and an arithmetic mean roughness Ra of not more than 10 nm. Since arithmetic mean roughness Ra was not more than 10 nm, an influence of scattering could be eliminated in transmittance evaluation. In the case of the removal using a laser, the degree of parallelization thereof needed to be reduced as small as possible and a spread width thereof needed to be taken into consideration in order to eliminate a deviation between the growth surface and the removed-side surface. After the polishing, the elimination of deviation needs to be maintained and was maintained to be not more than 0.5°. For the removal using the ion implantation, the elimination of deviation was maintained to be not more than 0.02°. Only in Example 1-4, the removal was performed using the laser, whereas in the other samples, the removal was performed using the ion implantation and the subsequent electrolytic etching. In the case where a precise removal method such as those described above had not been used, variation of not less than ±2° occurred already at this point of time. In the polishing for optical measurement, the removal using ion implantation is more preferable because the degree of parallelization does not need to be taken into consideration particularly; however, the degree of parallelization is important in the present examples in order to control to reduce the off angle variation.

For each of single-crystal diamond materials 20 obtained through the removal, Table 1 shows: the state of the crystal defect points in the main surface; the number of the crystal defect line-like gathered regions in parallel; the density of the crystal defect points; the density of the combined dislocation points; the number of the single-crystal diamond layers; the thickness of the single-crystal diamond material; the off angle of the main surface; the concentration (average concentration) of the non-substitutional nitrogen atoms; the concentration (average concentration) of the substitutional nitrogen; the concentration (average concentration) of all the nitrogen atoms; the transmittance for light having a wavelength of 400 nm; and the transmittance for light having a wavelength of 600 nm. Here, the state of the crystal defect points in the main surface, the number of the crystal defect line-like gathered regions in parallel, the density of the crystal defect points, and the density of the combined dislocation points were observed and calculated based on an X-ray topography image for the main surface. The off angle of the main surface was measured and calculated by precise X-ray diffraction. The concentration of all the nitrogen atoms was measured by SIMS. The concentration of the substitutional nitrogen atoms was measured by ESR. The concentration of the non-substitutional nitrogen atoms was calculated from a difference between the concentration of all the nitrogen atoms and the concentration of the substitutional nitrogen atoms. The transmittance for light having a wavelength of 400 nm and the transmittance for light having a wavelength of 600 nm were measured using a spectrophotometer.

Single-crystal diamond material 20 was machined into a shape of cutter edge, and was used to cut a workpiece for the purpose of evaluation of chipping resistance. For a cutter, RF4080R provided by Sumitomo Electric Industries HardMetal was used. For a wiper chip, SNEW1204ADFR-WS provided by Sumitomo Electric Industries HardMetal was used. As a lathe, NV5000 provided by MOM SEIKI was used. A cutting speed was set at 2000 m/min, an amount of cut was set at 0.05 mm, and an amount of feed was set at 0.05 mm/cutting edge. For the workpiece, an aluminum material A5052 was used. After cutting the workpiece for 30 km, a chipping resistance evaluation I was performed based on the number of chippings of not less than 5 µm in the cutter edge. Results thereof are shown in Table 1. In chipping resistance evaluation I, when the number of chippings was not more than 1, it was considered as a usable excellent product. Moreover, a chipping resistance evaluation II was performed based on the number of chippings of not less than 5 µm in the cutter edge after cutting a workpiece, which was aluminum material A5052, for 30 km under conditions that a cutting speed was set at 2000 m/min, an amount of cut was set at 0.10 mm, and an amount of feed was set at 0.10 mm/cutting edge. Results thereof are shown in Table 1. In chipping resistance evaluation II, when the number of chippings was not more than 4, it was considered as a usable excellent product.

each of chipping resistance evaluation I and chipping resistance evaluation II because the concentration of the substitutional nitrogen atoms was higher than the concentration of

TABLE 1

|  |  | Example 1-1 | Example 1-2 | Example 1-3 | Example 1-4 | Example 1-5 |
|---|---|---|---|---|---|---|
| Diamond Seed Crystal | Formation Method (Seed Crystal Type) | HPHT (Type Ib) | HPHT (Type Ib) | HPHT (Type Ib) | HPHT (Type Ib) | HPHT (Type Ib) |
|  | Off Angle of Main Surface (°) | 2 | 2 | 2 | 2 | 2 |
|  | Load during Polishing (kgf) | 10 to 20 | 10 to 20 | 0.5 to 5 | 0.5 to 5 | 0.5 to 5 |
|  | Selection for Polishing Direction during Polishing | Rotation→Fixation | Rotation→Fixation | Rotation→Fixation | Fixation | Fixation |
|  | Groove Formed through Photolithography — Existence/Non-Existence | Not Exist | Exist | Exist | Not Exist | Exist |
|  | Relation between Groove and Off Angle | — | Parallel | Parallel | — | Perpendicular |
|  | Width of Groove (μm) | — | 3 | 3 | — | 3 |
|  | Interval of Groove (μm) | — | 200 | 200 | — | 200 |
|  | State of Crystal Defect Points | Points Gathered in the Form of Lines | Points Gathered in the Form of Lines | Points Gathered in the Form of Lines | Interspersed | Interspersed |
|  | Density of Seed Crystal Defect Points ($mm^{-2}$) | 170 | 410 | 150 | 16 | 20 |
|  | Size of Diamond Seed Crystal ($mm^2$) | 4 × 4 | 4 × 4 | 4 × 4 | 4 × 4 | 4 × 4 |
|  | Thickness of Diamond Seed Crystal (mm) | 1 | 1.6 | 1 | 0.8 | 0.7 |
| Single-Crystal Diamond Material | State of Crystal Defect Points | Groups of Points Gathered in the Form of Lines | Groups of Points Gathered in the Form of Lines | Groups of Points Gathered in the Form of Lines | Interspersed | Interspersed |
|  | Number of Crystal Defect Line-Like Gathered Regions in Parallel | 25 | 38 | 18 | — | — |
|  | Density of Crystal Defect Points ($mm^{-2}$) | 1200 | 2500 | 1100 | 16 | 20 |
|  | Density of Combined Dislocation Points ($mm^{-2}$) | 400 | 1100 | 350 | 0 | 0 |
|  | Number of Single-Crystal Diamond Layers | 2 | 2 | 1 | 1 | 1 |
|  | Thickness of Single-Crystal Diamond Material (μm) | 1 | 0.7 | 0.6 | 0.5 | 0.5 |
|  | Off Angle of Crystal Growth Main Surface (°) | 2 | 2 | 2 | 2 | 2 |
|  | Angle of Deviation from Parallelism between Crystal Growth Main Surface and Main Surface Opposite to Crystal Growth Main Surface (°) | 0.01 | 0.03 | 0.02 | 0.2 | 0.01 |
|  | Maximum Height Difference of Undulation in Main Surface Opposite to Crystal Growth Main Surface (μm/mm) | 0.2 | 0.3 | 0.1 | 0.05 | 0.05 |
|  | Arithmetic Mean Roughness Ra of Main Surface Opposite to Crystal Growth Main Surface (μm) | 0.006 | 0.005 | 0.004 | 0.002 | 0.003 |
|  | Concentration of Non-Substitutional Nitrogen Atoms (ppm) | 35.0 | 51.5 | 31.7 | 0.1 | 0.3 |
|  | Concentration of Substitutional Nitrogen Atoms (ppm) | 0.6 | 0.5 | 0.3 | 0.3 | 0.4 |
|  | Concentration of All Nitrogen Atoms (ppm) | 35.6 | 52.0 | 32.0 | 0.4 | 0.7 |
|  | Transmittance for Light having Wavelength of 400 nm (%; Conversion with 500 μm Thickness) | 8 | 6 | 9 | 65 | 61 |
|  | Transmittance for Light having Wavelength of 600 nm (%; Conversion with 500 μm Thickness) | 53 | 45 | 48 | 69 | 68 |
|  | Chipping Resistance Evaluation I (Number of Chippings) | 0 | 0 | 0 | 5 | 4 |
|  | Chipping Resistance Evaluation II (Number of Chippings) | 1 | 1 | 1 | 12 | 8 |

With reference to Table 1, in each of Example 1-1 to Example 1-3, the number of chippings was low in each of chipping resistance evaluation I and chipping resistance evaluation II because the concentration of the non-substitutional nitrogen atoms was not more than 200 ppm, the concentration of the substitutional nitrogen atoms was lower than the concentration of the non-substitutional nitrogen atoms, the single-crystal diamond material had the crystal growth main surface having an off angle of not more than 20°, and the groups of the crystal defect points were gathered in the form of lines in the crystal growth main surface that was the main surface. In contrast, in each of Example 1-4 and Example 1-5, the number of chippings was high in each of chipping resistance evaluation I and chipping resistance evaluation II because the concentration of the substitutional nitrogen atoms was higher than the concentration of the non-substitutional nitrogen atoms and the crystal defect points were not gathered and were just interspersed in the crystal growth main surface that was the main surface although the concentration of the non-substitutional nitrogen atoms was not more than 200 ppm and the off angle of the main surface was not more than 20°. Here, the crystal defect points were observed in the crystal growth main surface, which was the outermost surface of the single-crystal diamond material, whereas the off angle was measured in the crystal growth main surface at the initial stage of the growth. The crystal growth main surface at the initial stage of the growth substantially corresponded to an average surface of the crystal growth main surface of 50% of the single-crystal diamond material at the center thereof. The crystal growth main surface at the initial stage of the growth was calculated by determining a direction of inclination by measuring two cross sections substantially orthogonal to the crystal growth main surface by CL (cathode luminescence) in 1 mm at the center of the single-crystal diamond material.

Although the crystal growth main surfaces of the present single-crystal diamond materials were polished to be flat, evaluation results thereof were the same values as those before the polishing. For each of the present single-crystal diamond materials, the ion implantation and electrolytic etching were performed in the step of removing from the diamond seed crystal; however, there was no large difference in evaluation results when employing the method of slicing using a laser. In the method of slicing using the laser, after the evaluations, mechanical polishing was performed to form a normal flat surface and then this plate was cut by a laser into a desired size, thereby obtaining a chip for a wire drawing die. Then, a wire drawing die was produced.

In the single-crystal diamond chip just before being formed into a die, the transmittances for light were measured; however, the transmittances for light were substantially the same as those in the case of the single-crystal diamond material. The transmittance of the die was measured using a microscopic visible ultraviolet spectroscopy photometer. The laser was employed to cut the main surface of the single-crystal diamond material strictly perpendicularly in the <100> direction, whereby the main surface of the single-crystal diamond chip corresponded to (100). The wire drawing dies are provided with: holes (A group) formed by machining the main surfaces of the single-crystal diamond chips strictly perpendicularly; and holes (B group) formed by machining and angled off by 2° in a direction angled off by 2°. Because the off direction had been known in relation with the main surface since the synthesis of the single-crystal diamond material and the formation of the chip, a mark was provided to indicate the direction for the purpose of alignment in the same direction.

As a result of evaluating five wire drawing dies of the A group and five wire drawing dies of the B group, the axis of each of the holes of the B group was off by less than 1° relative to the low-index plane with a crystal plane of (100) (variation in the axes of the holes was less than 0.2°). The axis of each of the holes of the A group was off by less than 3° relative to the low-index plane with the crystal plane of (100) (variation in the axes of the holes was less than 0.2°). Table 2 shows variation in concentration of the non-substitutional nitrogen atoms in each of the A group and the B group (variation relative to the average concentration). Moreover, Table 2 shows wear rate variation in each of the A group and the B group (variation relative to the average wear rate) and shows wear rate variation in the whole of the A group and the B group (variation relative to the average wear rate).

With reference to Table 2, in each of Example 1-1 to Example 1-3, the variation in concentration of the non-substitutional nitrogen atoms in each of the A group and the B group was not more than ±20%, the wear rate variation in each of the A group and the B group was not more than ±3%, and the wear rate variation in the whole of the A group and the B group was not more than ±5%. All of these were small. On the other hand, in each of Example 1-4 and Example 1-5, a large chipping occurred. Hence, it was difficult to measure the wear rate variation in each of the A group and the B group.

In each of Example 1-1 to Example 1-3, since the variation among the angles of the axes of the holes was less than 0.2° as in the A group and the B group, the wear rate variation was small irrespective of the difference therebetween in the angle of each of the axes of the holes, i.e., 1° and 3°. However, in the whole of the A group and the B group, the variation among the angles of the axes of the holes was not less than 3°. Hence, it was found that the wear rate variation as a whole became large. This resulted from the off angle variation among the diamond materials in the first place. It was also found that when the off angle of the diamond material was small, this variation can be suppressed readily. Moreover, it was also found that when the off angle was small relative to the index plane of the main surface of the diamond chip, the variation among the angles of the axes of the holes becomes small, which is more preferable.

Example 2

Single-crystal diamond materials of Example 2-1 to Example 2-12 were produced in the same manner as in Example 1 except for conditions shown in Table 3 and Table 4, and were subjected to chipping resistance evaluation I and chipping resistance evaluation II. Results thereof are shown in Table 3 and Table 4. Here, for the polishing, attention was paid to selection of polishing directions, and therefore Table 3 and 4 show the polishing directions distinctively. "Rotation→Fixation" in Tables 3 and 4 indicates a method in which a substrate made relatively flat by a general method is polished for 2 hours while being rotated (turned) and then is fixed and polished for 1 hour. With this, defects are likely to be introduced in the form of lines. "Fixation→Rotation" indicates a method in which a substrate made relatively flat by a general method is fixed and polished for 1 hour and then is polished for 2 hours while being rotated. With this, defects gathered not in the form of lines are likely to be introduced. The loads during the polishing in Tables 3 and 4 are loads in the case of "Rotation→Fixation" and "Fixation→Rotation". Since the AsGrown surface of a substrate formed by CVD is smooth, single-crystal diamond materials can be grown thereon without polishing. Hence, an experiment was also conducted with regard to a diamond seed crystal not polished.

TABLE 2

|  | Example 1-1 | Example 1-2 | Example 1-3 | Example 1-4 | Example 1-5 |
|---|---|---|---|---|---|
| Variation in Concentration of Non-Substitutional Nitrogen Atoms within Each of A and B Groups (Not More Than %) | ±20 | ±20 | ±20 | — | — |
| Wear Rate Variation within Each of A and B Groups (Not More Than %) | ±2 | ±3 | ±2 | — | — |
| Wear Rate Variation within Whole of A and B Groups (Not More Than %) | ±4 | ±5 | ±4 | — | — |

TABLE 3

| | | Example 2-1 | Example 2-2 | Example 2-3 | Example 2-4 | Example 2-5 | Example 2-6 |
|---|---|---|---|---|---|---|---|
| Diamond Seed Crystal | Formation Method (Seed Crystal Type) | HPHT (Type IIa) | HPHT (Type IIa) | HPHT (Type Ib) | HPHT (Type Ib) | HPHT (Type Ib) | HPHT (Type Ib) |
| | Off Angle of Main Surface (°) | 2 | 3 | 3 | 3 | 5 | 3 |
| | Load during Polishing (kgf) | 5 to 10 | 10 to 20 | 15 to 25 | 20 to 30 | 10 to 20 | 30 to 50 |
| | Selection for Polishing Direction during Polishing | Fixation → Rotation | Fixation → Rotation | Fixation → Rotation | Fixation → Rotation | Rotation → Fixation | Rotation → Fixation |
| | Groove Formed Through Photolithography — Existence/Non-Existence | Not Exist | Not Exist | Not Exist | Not Exist | Not Exist | Not Exist |
| | Relation between Groove and Off Angle | — | — | — | — | — | — |
| | Width of Groove (μm) | — | — | — | — | — | — |
| | Interval of Groove (μm) | — | — | — | — | — | — |
| | State of Crystal Defect Point | Points Gathered | Points Gathered | Points Gathered | Points Gathered | Points Gathered in the Form of Lines | Points Gathered in the Form of Lines |
| | Density of Seed Crystal Defect Points ($mm^{-2}$) | 1 | 3 | 21 | 21 | 130 | 450 |
| | Size of Diamond Seed Crystal ($mm^2$) | 4 × 4 | 4 × 4 | 4 × 4 | 4 × 4 | 4 × 4 | 4 × 4 |
| | Thickness of Diamond Seed Crystal (mm) | 1.6 | 1.8 | 3.2 | 3.5 | 1.7 | 3.5 |
| Single-Crystal Diamond Material | State of Crystal Defect Points | Groups of Points Gathered | Groups of Points Gathered | Groups of Points Gathered | Groups of Points Gathered | Groups of Points Gathered in the Form of Lines | Groups of Points Gathered in the Form of Lines |
| | Number of Crystal Defect Line-Like Gathered Regions in Parallel | — | — | — | — | 23 | 95 |
| | Density of Crystal Defect Points ($mm^{-2}$) | 2 | 22 | 90 | 310 | 1100 | 7500 |
| | Density of Combined Dislocation Points ($mm^{-2}$) | 0 | 5 | 22 | 80 | 320 | 2800 |
| | Number of Single-Crystal Diamond Layers | 1 | 1 | 1 | 1 | 1 | 1 |
| | Thickness of Single-Crystal Diamond Material (μm) | 0.6 | 0.7 | 0.8 | 0.9 | 0.8 | 1.1 |
| | Off Angle of Crystal Growth Main Surface (°) | 2 | 3 | 3 | 3 | 5 | 3 |
| | Angle of Deviation from Parallelism between Crystal Growth Surface and Main Surface Opposite to Crystal Growth Main Surface (°) | 0.01 | 0.01 | 0.01 | 0.01 | 0.02 | 0.03 |
| | Maximum Height Difference of Undulation in Main Surface Opposite to Crystal Growth Main Surface (μm/mm) | 0.02 | 0.04 | 0.05 | 0.05 | 0.4 | 0.6 |
| | Arithmetic Mean Roughness Ra of Main Surface Opposite to Crystal Growth Main Surface (μm) | 0.0005 | 0.001 | 0.003 | 0.008 | 0.007 | 0.006 |
| | Concentration of Non-Substitutional Nitrogen Atoms (ppm) | 1.1 | 3.3 | 5.8 | 9.6 | 44.4 | 19.7 |
| | Concentration of Substitutional Nitrogen Atoms (ppm) | 0.1 | 0.2 | 0.2 | 0.4 | 0.6 | 0.3 |
| | Concentration of All Nitrogen Atoms (ppm) | 1.2 | 3.5 | 6.0 | 10.0 | 45.0 | 20.0 |
| | Transmittance for Light having Wavelength of 400 nm (%; Conversion with 500 μm Thickness) | 57 | 43 | 26 | 14 | 7 | 9 |
| | Transmittance for Light having Wavelength of 600 nm (%; Conversion with 500 μm Thickness) | 68 | 64 | 58 | 53 | 48 | 45 |
| | Chipping Resistance Evaluation I (Number of Chippings) | 1 | 1 | 0 | 0 | 0 | 0 |
| | Chipping Resistance Evaluation II (Number of Chippings) | 3 | 3 | 2 | 2 | 1 | 1 |

TABLE 4

| | | Example 2-7 | Example 2-8 | Example 2-9 |
|---|---|---|---|---|
| Diamond Seed Crystal | Formation Method (Seed Crystal Type) | CVD | CVD | CVD |
| | Off Angle of Main Surface (°) | 2 | 5 | 8 |
| | Load during Polishing (kgf) | 10 to 20 | 10 to 20 | 20 to 30 |
| | Selection for Polishing Direction during Polishing | Fixation → Rotation | Fixation → Rotation | Rotation → Fixation |
| | Groove Formed Through Photolithography — Existence/Non-Existence | Not Exist | Not Exist | Not Exist |
| | Relation between Groove and Off Angle | — | — | — |
| | Width of Groove (μm) | — | — | — |
| | Interval of Groove (μm) | — | — | — |
| | State of Crystal Defect Points | Groups of Points Gathered | Groups of Points Gathered | Groups of Points Gathered in the Form of Lines |
| | Density of Seed Crystal Defect Points ($mm^{-2}$) | 1500 | 2100 | 3100 |
| | Size of Diamond Seed Crystal ($mm^2$) | 4 × 4 | 4 × 4 | 4 × 4 |
| | Thickness of Diamond Seed Crystal (mm) | 1.6 | 1.6 | 3.2 |

TABLE 4-continued

| Single-Crystal Diamond Material | State of Crystal Defect Points | | Groups of Points Gathered in the Form of Lines | Groups of Points Gathered in the Form of Lines | Groups of Points Gathered in the Form of Lines |
|---|---|---|---|---|---|
| | Number of Crystal Defect Line-Like Gathered Regions in Parallel | | 120 | 180 | 310 |
| | Density of Crystal Defect Points ($mm^{-2}$) | | 14000 | 25000 | 50000 |
| | Density of Combined Dislocation Points ($mm^{-2}$) | | 5500 | 9600 | 23000 |
| | Number of Single-Crystal Diamond Layers | | 2 | 3 | 3 |
| | Thickness of Single-Crystal Diamond Material (μm) | | 1.2 | 1.1 | 1.1 |
| | Off Angle of Crystal Growth Main Surface (°) | | 2 | 5 | 8 |
| | Angle of Deviation from Parallelism between Crystal Growth Main Surface and Main Surface Opposite to Crystal Growth Main Surface (°) | | 0.01 | 0.01 | 0.02 |
| | Maximum Height Difference of Undulation in Main Surface Opposite to Crystal Growth Main Surface (μm/mm) | | 0.04 | 0.03 | 0.4 |
| | Arithmetic Mean Roughness Ra of Main Surface Opposite to Crystal Growth Main Surface (μm) | | 0.001 | 0.001 | 0.005 |
| | Concentration of Non-Substitutional Nitrogen Atoms (ppm) | | 31.0 | 49.55 | 109 |
| | Concentration of Substitutional Nitrogen Atoms (ppm) | | 0.1 | 0.45 | 1 |
| | Concentration of All Nitrogen Atoms (ppm) | | 31.1 | 50.0 | 110 |
| | Transmittance for Light having Wavelength of 400 nm (%; Conversion with 500 μm Thickness) | | Less than 1 | Less than 1 | Less than 1 |
| | Transmittance for Light having Wavelength of 600 nm (%; Conversion with 500 μm Thickness) | | 28 | 8 | 4 |
| | Chipping Resistance Evaluation I (Number of Chippings) | | 0 | 0 | 0 |
| | Chipping Resistance Evaluation II (Number of Chippings) | | 0 | 0 | 0 |

| | | | Example 2-10 | Example 2-11 | Example 2-12 |
|---|---|---|---|---|---|
| Diamond Seed Crystal | Formation Method (Seed Crystal Type) | | CVD | CVD | CVD |
| | Off Angle of Main Surface (°) | | 17 | 3 | 3 |
| | Load during Polishing (kgf) | | 20 to 30 | Not Polished | Not Polished |
| | Selection for Polishing Direction during Polishing | | Rotation→Fixation | Not Polished | Not Polished |
| | Groove Formed Through Photolithography | Existence/Non-Existence | Not Exist | Not Exist | Not Exist |
| | | Relation between Groove and Off Angle | — | — | — |
| | | Width of Groove (μm) | — | — | — |
| | | Interval of Groove (μm) | — | — | — |
| | State of Crystal Defect Points | | Groups of Points Gathered in the Form of Lines | Groups of Points Gathered in the Form of Lines | Groups of Points Gathered in the Form of Lines |
| | Density of Seed Crystal Defect Points ($mm^{-2}$) | | 3500 | 230 | 200 |
| | Size of Diamond Seed Crystal ($mm^2$) | | 4 × 4 | 4 × 4 | 4 × 4 |
| | Thickness of Diamond Seed Crystal (mm) | | 3.2 | 0.7 | 0.8 |
| Single-Crystal Diamond Material | State of Crystal Defect Points | | Groups of Points Gathered in the Form of Lines | Groups of Points Gathered in the Form of Lines | Groups of Points Gathered in the Form of Lines |
| | Number of Crystal Defect Line-Like Gathered Regions in Parallel | | 330 | 18 | 15 |
| | Density of Crystal Defect Points ($mm^{-2}$) | | 50000 | 1900 | 1700 |
| | Density of Combined Dislocation Points ($mm^{-2}$) | | 23000 | 850 | 600 |
| | Number of Single-Crystal Diamond Layers | | 3 | 3 | 2 |
| | Thickness of Single-Crystal Diamond Material (μm) | | 1.1 | 1.2 | 1.2 |
| | Off Angle of Crystal Growth Main Surface (°) | | 17 | 3 | 3 |
| | Angle of Deviation from Parallelism between Crystal Growth Main Surface and Main Surface Opposite to Crystal Growth Main Surface (°) | | 0.03 | 0.01 | 0.2 |
| | Maximum Height Difference of Undulation in Main Surface Opposite to Crystal Growth Main Surface (μm/mm) | | 0.5 | 0.04 | 150 |
| | Arithmetic Mean Roughness Ra of Main Surface Opposite to Crystal Growth Main Surface (μm) | | 0.007 | 0.003 | 0.003 |
| | Concentration of Non-Substitutional Nitrogen Atoms (ppm) | | 190 | 24.8 | 21.6 |
| | Concentration of Substitutional Nitrogen Atoms (ppm) | | 10 | 0.2 | 0.4 |
| | Concentration of All Nitrogen Atoms (ppm) | | 200 | 25.0 | 22.0 |
| | Transmittance for Light having Wavelength of 400 nm (%; Conversion with 500 μm Thickness) | | Less than 1 | 4 | 4 |
| | Transmittance for Light having Wavelength of 600 nm (%; Conversion with 500 μm Thickness) | | 2 | 38 | 38 |
| | Chipping Resistance Evaluation I (Number of Chippings) | | 0 | 0 | 0 |
| | Chipping Resistance Evaluation II (Number of Chippings) | | 0 | 0 | 0 |

With reference to Table 3 and Table 4, in each of Example 2-1 to Example 2-12, the concentration of the non-substitutional nitrogen atoms was not more than 200 ppm and the off angle of the main surface was not more than 20°. Moreover, the groups of the crystal defect points were gathered or gathered in the form of lines in the crystal growth main surface that was the main surface. Accordingly, the number of chippings was low in each of chipping resistance evaluation I and chipping resistance evaluation II. Here, in each of Example 1-1 to Example 2-10, the single-crystal diamond material was removed from the diamond seed crystal. Only in Example 2-11, the single-crystal diamond material was not removed from the diamond seed crystal, and the CVD diamond seed crystal was not polished in the evaluation of Example 2-11. On the other hand, in the evaluation of Example 2-12, the single-crystal diamond material was removed from the CVD diamond seed crystal not polished. In Example 2-12, since the single-crystal diamond material was removed without polishing, undulation became large in the main surface opposite to the crystal growth main surface.

In Example 2-13, synthesis was attempted to obtain a single-crystal diamond material in which the concentration of the non-substitutional nitrogen atoms was 250 ppm; however, a diamond material including not less than 15% of non-single-crystal diamond and non-diamond was obtained, with the result that the evaluations in Table 3 and Table 4 could not be performed. Therefore, it was also difficult to produce a perforated tool. In Example 2-14, production of a single-crystal diamond material was attempted under the same conditions as those in Example 2-4 except that the off angle of the diamond seed crystal was 25°; however, a diamond material including not less than 5% of non-single-crystal diamond and non-diamond was obtained, with the result that the evaluations in Table 3 and Table 4 could not be performed.

Also in Table 3 and Table 4, the crystal defect points were observed in the crystal growth main surface, which was the outermost surface of the single-crystal diamond material, whereas the off angle was measured in the crystal growth main surface at the initial stage of the growth. The crystal growth main surface at the initial stage of the growth substantially corresponded to an average surface of the crystal growth main surface of 50% of the single-crystal diamond material at the center thereof. The crystal growth main surface at the initial stage of the growth was calculated by determining a direction of inclination by measuring two cross sections substantially orthogonal to the crystal growth main surface by CL (cathode luminescence) in 1 mm at the center of the single-crystal diamond material.

It should be noted that in each of Table 1, Table 3, and Table 4 above, the expression "Groups of Points Gathered" indicates that the areas of the groups of the points are in contact with or overlap with one another, i.e., are connected to one another. The expression "Groups of Points Gathered in the Form of Lines" indicates that the groups of the points are gathered to be connected to one another in the form of elongated lines. The expression "Groups of Points" refers to a collection of crystal defect points that are based on crystal defect lines branched from the same starting point. The expression "Crystal Defect Points of Seed Crystal" refers to a combination of starting points of groups of crystal defect lines of a single-crystal layer and starting points of crystal defect lines that are not in groups. The expression "Gathered" indicates that 70% of all the crystal defect points in a specific range are concentrated in 50% of the entire area of the specific range. Here, regarding the specific range for the crystal defect points, it is assumed that a range of one crystal defect point is a range having a radius corresponding to a distance to a proximal crystal defect point. The expression "Interspersed" refers to a state in which there is no gathering defined as above.

It should be noted that for comparison, as Example 2-15, Example 2-16, and Example 2-17, type Ib single-crystal diamond materials each produced by the HPHT (high-pressure/high-temperature) method and a natural type Ia single-crystal diamond material were subjected to the evaluations in Table 3 and Table 4 above. Results thereof are shown in Table 5.

TABLE 5

|  | Example 2-15 | Example 2-16 | Example 2-17 |
|---|---|---|---|
| Method of Forming Single-Crystal Diamond Material (Crystal Type) | HPHT (Type Ib) | HPHT (Type Ib) | Natural (Type Ia) |
| State of Crystal Defect Points | Interspersed | Interspersed | — |
| Number of Crystal Defect Line-Like Gathered Regions in Parallel | — | — | — |
| Density of Crystal Defect Points ($mm^{-2}$) | 15 | 10 | — |
| Density of Combined Dislocation Points ($mm^{-2}$) | 0 | 0 | — |
| Number of Single-Crystal Diamond Layers | 1 | 1 | — |
| Thickness of Single-Crystal Diamond Material (μm) | 2 | 2 | 2 |
| Set Off Angle of Crystal Growth Main Surface (°) | 0 | 0 | 0 |
| Angle of Deviation from Parallelism between Crystal Growth Main Surface and Main Surface Opposite to Crystal Growth Main Surface (°) | 2 | 2 | 22 |
| Maximum Height Difference of Undulation in Main Surface Opposite to Crystal Growth Main Surface (μm/mm) | 80 | 30 | 50 |
| Arithmetic Mean Roughness Ra of Main Surface Opposite to Crystal Growth Main Surface (μm) | 20 | 12 | 14 |
| Concentration of Non-Substitutional Nitrogen Atoms (ppm) | 0 | 0 | 0 |
| Concentration of Substitutional Nitrogen Atoms (ppm) | 90 | 200 | 1800 |
| Concentration of All Nitrogen Atoms (ppm) | 90 | 200 | 1800 |
| Transmittance for Light having Wavelength of 400 nm (%; Conversion with 500 μm Thickness) | 3 | 1 | 30 |
| Transmittance for Light having Wavelength of 600 nm (%; Conversion with 500 μm Thickness) | 68 | 68 | 69 |
| Chipping Resistance Evaluation I (Number of Chippings) | 0 | 0 | 0 |
| Chipping Resistance Evaluation II (Number of Chippings) | 1 | 1 | 1 |

Example 3

For each of the single-crystal diamond materials in Example 2-1 to Example 2-11 in each of which the number of chippings was not more than 1 in chipping resistance evaluation I, a diamond chip and a diamond perforated tool were produced to evaluate off angle variation and wear rate variation. Results thereof are shown in Table 5 to Table 7. Moreover, for comparison, each of type Ib single-crystal diamond materials each produced by the HPHT (high-pressure/high-temperature) method and a natural type Ia single-crystal diamond material was employed to produce a diamond chip and a diamond perforated tool, which were then evaluated in terms of off angle variation and wear rate variation. Results thereof are shown in Table 6 to Table 8.

Hole axis and crystal plane orientation were confirmed and evaluated using X-ray diffraction with the chip being fixed to a mount such that a perpendicular direction corresponds to a direction in which a plurality of outlines of the hole when viewed in the hole axis direction using a microscope (outlines of the outermost circle in which the hole crosses the rectangular parallelepiped of the chip, the innermost circle that can be confirmed as the minimum diameter in the hole, and the like) are concentric. The evaluation with the X rays were performed in the same manner as that in a general method of evaluating fluctuation, off angle, or pole figure of crystal of a plate-like single-crystal diamond. Since the perpendicular direction of the X-ray diffraction measurement corresponds to the direction of the hole axis, the inclination angle of the hole axis could be confirmed by measuring the off inclination of the crystal plane.

TABLE 6

| | | Example 3-1 | Example 3-2 | Example 3-3 | Example 3-4 | Example 3-5 | Example 3-6 | Example 3-7 |
|---|---|---|---|---|---|---|---|---|
| Diamond Chip | Method of Forming Single-Crystal Diamond Material (Crystal Type) | CVD | CVD | CVD | CVD | CVD | CVD | CVD |
| | Single-Crystal Diamond Material (Example Number) | Example 2-4 | Example 2-4 | Example 2-4 | Example 2-6 | Example 2-6 | Example 2-6 | Example 2-9 |
| | Reference Crystal Plane Orientation of Chip | (100) | (100) | (100) | (110) | (110) | (110) | (311) |
| | Designed Off Angle between Chip Main Surface and Crystal Plane Orientation (°) | 1 | 7 | 10 | 0.2 | 0.5 | 20 | 0.5 |
| | Number of Cut Chips | 6 | 6 | 5 | 6 | 6 | 5 | 6 |
| | Off Angle Variation (°) | ±0.1 | ±0.4 | ±0.7 | ±0.3 | ±0.2 | ±1.0 | ±0.5 |
| | Variation in Concentration of Non-Substitutional Nitrogen Atoms (Less Than %) | ±25 | ±25 | ±25 | ±20 | ±20 | ±20 | ±20 |
| Wear Rate Variation of Diamond Perforated Tool (Less Than %) | | ±1.5 | ±2.8 | ±3.0 | ±1.5 | ±1.5 | ±3.5 | ±1.8 |

TABLE 7

| | | Example 3-8 | Example 3-9 | Example 3-10 | Example 3-11 | Example 3-12 | Example 3-13 | Example 3-14 |
|---|---|---|---|---|---|---|---|---|
| Diamond Chip | Method of Forming Single-Crystal Diamond Material (Crystal Type) | CVD | CVD | CVD | CVD | CVD | CVD | CVD |
| | Single-Crystal Diamond Material (Example Number) | Example 2-9 | Example 2-9 | Example 2-1 | Example 2-2 | Example 2-3 | Example 2-5 | Example 2-7 |
| | Reference Crystal Plane Orientation of Chip | (331) | (111) | (110) | (110) | (110) | (110) | (110) |
| | Designed Off Angle between Chip Main Surface and Crystal Plane Orientation (°) | 3 | 5 | 2 | 0.5 | 3 | 5 | 2 |
| | Number of Cut Chips | 6 | 6 | 5 | 5 | 5 | 5 | 5 |
| | Off Angle Variation (°) | ±0.5 | ±0.4 | ±0.1 | ±0.2 | ±0.1 | ±0.25 | ±0.1 |
| | Variation in Concentration of Non-Substitutional Nitrogen Atoms (Less Than %) | ±20 | ±20 | ±30 | ±30 | ±30 | ±20 | ±20 |
| Wear Rate Variation of Diamond Perforated Tool (Less Than %) | | ±2.0 | ±2.5 | ±1.0 | ±1.5 | ±1.5 | ±2.0 | ±2.0 |

TABLE 8

| | | Example 3-15 | Example 3-16 | Example 3-17 | Example 3-18 | Example 3-19 | Example 3-20 | Example 3-21 |
|---|---|---|---|---|---|---|---|---|
| Diamond Chip | Method of Forming Single-Crystal Diamond Material (Crystal Type) | CVD | CVD | CVD | CVD | HPHT (Type Ib) | HPHT (Type Ib) | Natural (Type Ia) |
| | Single-Crystal Diamond Material (Example Number) | Example 2-8 | Example 2-10 | Example 2-11 | Example 2-12 | Example 2-15 | Example 2-16 | Example 2-17 |

TABLE 8-continued

|  | Example 3-15 | Example 3-16 | Example 3-17 | Example 3-18 | Example 3-19 | Example 3-20 | Example 3-21 |
|---|---|---|---|---|---|---|---|
| Reference Crystal Plane Orientation of Chip | (110) | (110) | (110) | (110) | (110) | (111) | (111) |
| Designed Off Angle between Chip Main Surface and Crystal Plane Orientation (°) | 5 | 17 | 3 | 3 | 0 | 0 | 0 |
| Number of Cut Chips | 5 | 5 | 5 | 5 | 8 | 8 | 8 |
| Off Angle Variation (°) | ±0.25 | ±0.8 | ±0.1 | ±3.0 | ±5.0 | ±2.0 | ±22 |
| Variation in Concentration of Non-Substitutional Nitrogen Atoms (Less Than %) | ±20 | ±15 | ±20 | ±20 | ±70 | ±70 | ±80 |
| Wear Rate Variation of Diamond Perforated Tool (Less Than %) | ±2.0 | ±4.0 | ±2.0 | ±10 | ±40 | ±30 | ±90 |

With reference to Table 6 to Table 8, in each of the diamond chips of Example 3-1 to Example 3-18 employing the single-crystal diamond materials of Example 2-1 to Example 2-12 in each of which the number of chippings was not more than 1 in chipping resistance evaluation I, off angle variation was small (not more than ±1.0° in Example 3-1 to Example 3-17 and not more than ±3.0° in Example 3-18) and wear rate variation was small (not more than ±5.0% in Example 3-1 to Example 3-17 and not more than ±10% in Example 3-18). On the other hand, in each of the diamond chips of Example 3-19 to Example 3-21 employing the type Ib single-crystal diamond materials each produced by the HPHT (high-pressure/high-temperature) method (Example 2-15 and Example 2-16) and the natural type Ia single-crystal diamond material (Example 2-17), off angle variation was large (not more than ±5.0° in Example 3-19, not more than ±2.0° in Example 3-20, and not more than ±22° in Example 3-21), and wear rate variation was large (not more than ±30% to not more than ±90% in Example 3-19 to Example 3-21).

Moreover, based on the evaluation of the off angle variation and the wear rate variation in Example 3, it was found that a single-crystal diamond chip having a main surface with a small off angle is suitable because wear rate variation due to wire drawing is small. Here, the off angle of the main surface of the single-crystal diamond chip coincides with the off angle of the axis of the hole of the wire drawing die relative to the crystal plane orientation. Basically, a single-crystal diamond chip is obtained by perpendicularly cutting the single-crystal diamond material, so that it is determined that a smaller off angle of the main surface of the single-crystal diamond material is more preferable. However, it was sufficiently understood that when cutting such that the off angle of the single-crystal diamond material differs from the off angle of the single-crystal diamond chip, the off angle of the single-crystal diamond chip, which is closer to the final product, has a larger influence. The off angle of the main surface of the single-crystal diamond chip was reflected to substantially coincide with the off angle of the hole axis of the wire drawing die (perforated tool) relative to the crystal plane orientation.

The embodiments and examples disclosed herein are illustrative and non-restrictive in any respect. The scope of the present invention is defined by the terms of the claims, rather than the embodiments described above, and is intended to include any modifications within the scope and meaning equivalent to the terms of the claims.

REFERENCE SIGNS LIST

10: diamond seed crystal; 10c: conductive layer region; 10dp: seed crystal defect point; 10dd: seed crystal dislocation point; 10di: seed crystal damage point; 10dv: seed crystal chipping point; 10m, 20n: main surface; 20: single-crystal diamond material; 20d: crystal defect; 20dp, 20ndp: crystal defect point; 20dq, 21dq, 22dq: crystal defect line; 20m: crystal growth main surface; 20r: crystal defect line-like gathered region; 21, 22: single-crystal diamond layer; 212i: interface.

The invention claimed is:

1. A single-crystal chemical vapor deposition (CVD) diamond material, wherein a concentration of non-substitutional nitrogen atoms is not less than 1.1 ppm and not more than 200 ppm, a concentration of substitutional nitrogen atoms is lower than the concentration of the non-substitutional nitrogen atoms, and the single-crystal CVD diamond material has a crystal growth main surface having an off angle of not less than 2° and not more than 20°.

2. The single-crystal CVD diamond material according to claim 1, wherein the crystal growth main surface has an off angle of less than 7°.

3. The single-crystal CVD diamond material according to claim 1, wherein the concentration of the substitutional nitrogen atoms is less than 80 ppm.

4. The single-crystal CVD diamond material according to claim 1, wherein an angle of deviation from parallelism between the crystal growth main surface and a main surface opposite to the crystal growth main surface is less than 2°, the main surface opposite to the crystal growth main surface has an undulation with a maximum height difference Dm of not more than 10 μm/mm, and has an arithmetic mean roughness Ra of not more than 0.1 μm.

5. The single-crystal CVD diamond material according to claim 1, wherein in an X-ray topography image for the crystal growth main surface, groups of crystal defect points are gathered, each of the crystal defect points being a tip point of a crystal defect line reaching the crystal growth main surface, the crystal defect line representing a line in which a crystal defect exists.

6. The single-crystal CVD diamond material according to claim 5, wherein a density of the crystal defect points is more than 2 mm$^{-2}$.

7. The single-crystal CVD diamond material according to claim 5, wherein a density of combined dislocation points of the crystal defect points is more than 2 mm$^{-2}$, each of the combined dislocation points being a tip point of a combined dislocation reaching the crystal growth main surface, the combined dislocation resulting from a combination of at least either of a plurality of edge dislocations and a plurality of screw dislocations.

8. The single-crystal CVD diamond material according to claim 5, comprising a plurality of single-crystal diamond layers.

9. The single-crystal CVD diamond material according to claim 8, wherein the crystal defect line is newly generated or branched at an interface between the single-crystal diamond layers, and a density of the crystal defect points in the crystal growth main surface is higher than a density of the crystal defect points in a main surface opposite to the crystal growth main surface.

10. The single-crystal CVD diamond material according to claim 5, wherein a plurality of crystal defect line-like gathered regions exist in parallel, and in each of the plurality of crystal defect line-like gathered regions, groups of the crystal defect points are gathered to extend in a form of lines.

11. The single-crystal CVD diamond material according to claim 1, wherein when the single-crystal CVD diamond material has a thickness of 500 μm, a transmittance for light having a wavelength of 400 nm is not more than 60%.

12. A single-crystal chemical vapor deposition (CVD) diamond chip, wherein a concentration of non-substitutional nitrogen atoms is not less than 1.1 ppm and not more than 200 ppm, a concentration of substitutional nitrogen atoms is lower than the concentration of the non-substitutional nitrogen atoms, and the single-crystal CVD diamond chip has a main surface with an off angle of not less than 2° and not more than 20°.

13. A single-crystal CVD diamond chip cut out from the single-crystal CVD diamond material recited in claim 1.

14. The single-crystal CVD diamond chip according to claim 12, wherein the main surface of the single-crystal CVD diamond chip is a low-index plane represented by a Miller index of not less than −5 and not more than 5 in an integer.

15. The single-crystal CVD diamond chip according to claim 12, wherein
in an X-ray topography image for one of a crystal growth main surface and a main surface parallel to the crystal growth main surface of the single-crystal CVD diamond chip, groups of crystal defect points are gathered, each of the crystal defect points being a tip point of a crystal defect line reaching one of the crystal growth main surface and the main surface parallel to the crystal growth main surface, the crystal defect line representing a line in which a crystal defect exists, and
a density of the crystal defect points is more than 2 $mm^{-2}$.

16. A perforated tool comprising a single-crystal diamond die formed from the single-crystal CVD diamond chip recited in claim 12.

* * * * *